United States Patent
Gardner et al.

(10) Patent No.: US 12,087,817 B2
(45) Date of Patent: Sep. 10, 2024

(54) HIGH PERFORMANCE 3D VERTICAL TRANSISTOR DEVICE ENHANCEMENT DESIGN

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 429 days.

(21) Appl. No.: 17/490,182

(22) Filed: Sep. 30, 2021

(65) Prior Publication Data

US 2022/0238652 A1    Jul. 28, 2022

Related U.S. Application Data

(60) Provisional application No. 63/141,551, filed on Jan. 26, 2021.

(51) Int. Cl.
*H01L 29/08*      (2006.01)
*H01L 29/10*      (2006.01)

(52) U.S. Cl.
CPC ...... *H01L 29/0847* (2013.01); *H01L 29/1033* (2013.01)

(58) Field of Classification Search
CPC ............ H01L 29/0847; H01L 29/1033; H01L 29/42392; H01L 29/78696; H01L 29/165; H01L 21/76283; H01L 21/8221; H01L 21/823885; H01L 27/0688; H01L 29/78642
See application file for complete search history.

(56) References Cited

U.S. PATENT DOCUMENTS

2021/0376163 A1* 12/2021 Wang ................ H01L 29/78645

* cited by examiner

*Primary Examiner* — Changhyun Yi
(74) *Attorney, Agent, or Firm* — Oblon, McClelland, Maier & Neustadt, L.L.P.

(57) ABSTRACT

A microfabricated transistor device includes a vertical stack of two or more channels of field effect transistors on a semiconductor substrate. Each of the channels has a vertical conductive path relative to a surface of the semiconductor substrate. At least one of the channels includes a shell formed around a core material, the shell including epitaxial material. The vertical stack can include a channel for a PMOS field effect transistor, and a channel for an NMOS field effect transistor.

19 Claims, 20 Drawing Sheets

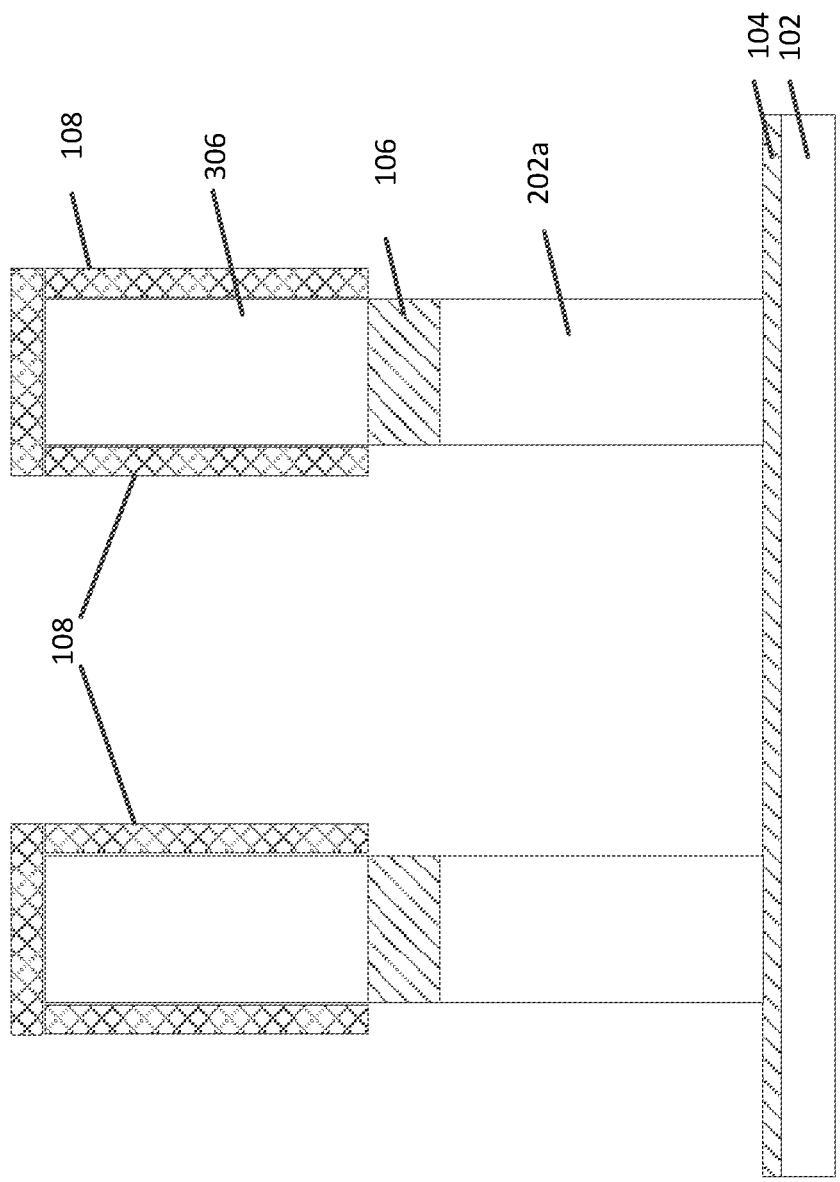

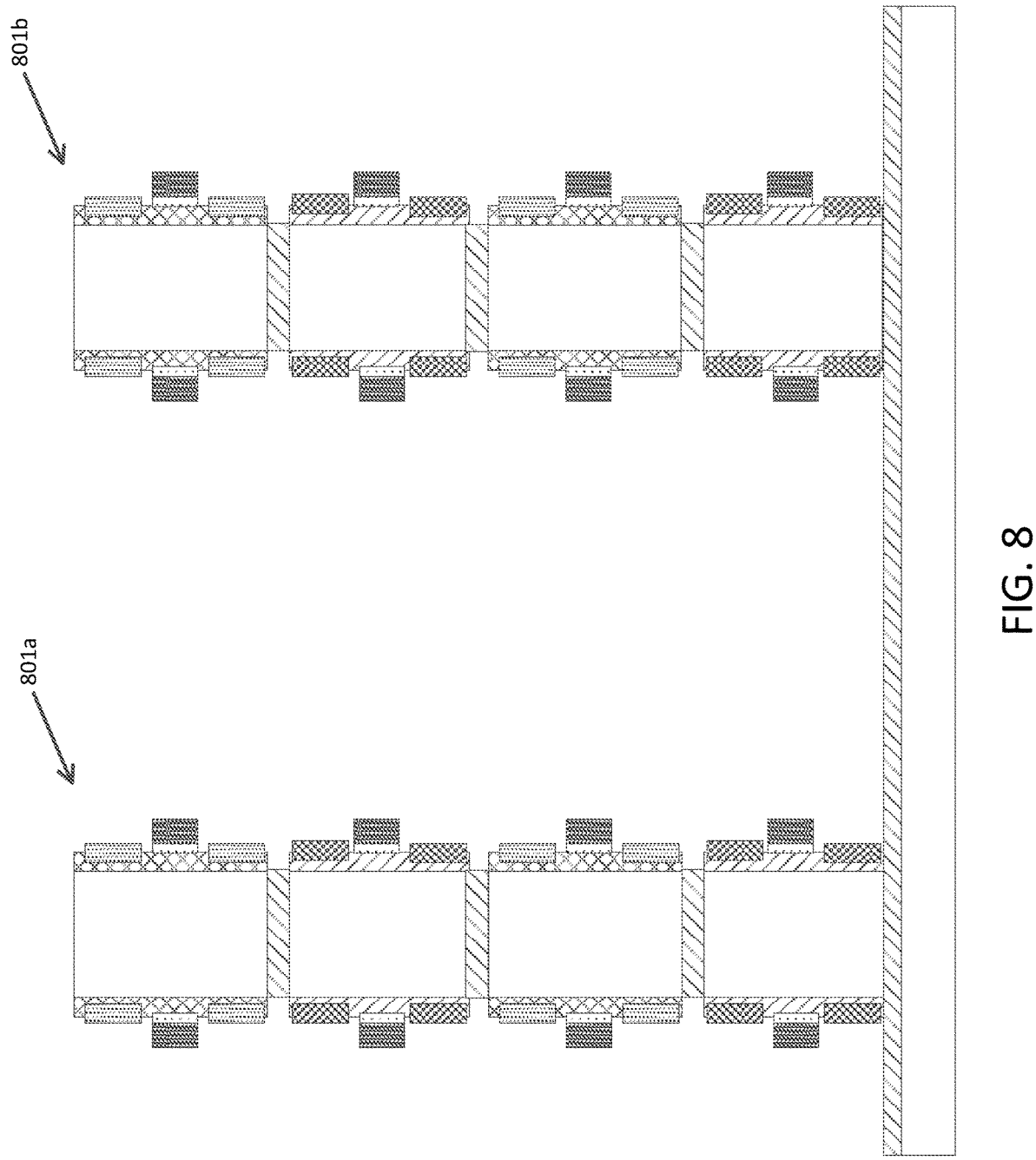

HIGH PERFORMANCE 3D VERTICAL TRANSISTOR DEVICE ENHANCEMENT DESIGN

CROSS-REFERENCE TO RELATED APPLICATIONS

This application claims the benefit of priority to provisional application no. 63/141,551 filed Jan. 26, 2021, the entire contents of which are incorporated herein by reference.

TECHNICAL FIELD

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

A first exemplary aspect is a method of forming a transistor device, including providing a substrate having a layer stack including a plurality of semiconductor channel layers separated by an intermediate layer, forming a plurality of core channel structures from the plurality of semiconductor channel layers respectively, the plurality of core channel structures each having a vertical conductive path relative to a surface of the substrate and includes first and second core channel structures vertically stacked on the substrate and separated by an isolation structure formed from the intermediate layer, and forming a first epitaxial shell around the first core channel structure such that the first epitaxial shell forms at least part of a first transistor channel for a first transistor to be formed from the first core channel structure.

A second exemplary aspect further includes forming first source/drain (S/D) regions and a first gate structure on the first epitaxial shell to complete the first transistor, and forming second S/D regions and a second gate structure on a second one of the core channel structures to complete a second transistor vertically stacked with the first transistor on the substrate, wherein the first transistor channel of the first transistor includes the first epitaxial shell and a second transistor channel of the second transistor is made of the second core channel structure.

A third exemplary aspect is wherein the forming a first epitaxial shell includes forming the second epitaxial shell with a same material as the first core channel structure such that the first and second transistors have a same conductivity type.

A fourth exemplary aspect is wherein the forming a first epitaxial shell includes forming the second epitaxial shell with a different material from the first core channel structure such that the first and second transistors have a different conductivity type.

A fifth exemplary aspect further includes forming a second epitaxial shell around a second one of the core channel structures such that the second epitaxial shell forms at least part of a second transistor channel for a second transistor to be formed from the second core channel structure, and forming first source/drain (S/D) regions and a gate structure on each of the first and second epitaxial shells respectively to complete the first and second respective transistors.

A sixth exemplary aspect is wherein the forming a second epitaxial shell includes forming the second epitaxial shell with a same material as the first epitaxial shell such that the first and second transistors have a same conductivity type.

A seventh exemplary aspect is wherein the forming a second epitaxial shell includes forming the second epitaxial shell with a different material from the first epitaxial shell such that the first and second transistors have a different conductivity type.

An eighth exemplary aspect is wherein the providing a substrate having a layer stack includes epitaxially growing a first semiconductor channel layer of the plurality of semiconductor channel layers on the substrate, epitaxially growing the intermediate layer on the first semiconductor channel layer, and epitaxially growing a semiconductor channel layer of the plurality of semiconductor channel layers on the intermediate layer.

A ninth exemplary aspect further includes forming the isolation structure by replacing the intermediate layer with a dielectric material.

A tenth exemplary aspect is wherein the providing a substrate having a layer stack includes providing a first substrate having a first semiconductor channel layer of the plurality of semiconductor channel layers formed on a first insulating layer of the first substrate, providing a second substrate having a second semiconductor channel layer of the plurality of semiconductor channel layers formed on a second insulating layer of the second substrate, and wafer bonding the first insulating layer to the second insulating layer to form a combined substrate having the layer stack including the plurality of semiconductor channel layers separated by bonded first and second insulating layers forming the intermediate layer.

An eleventh exemplary aspect is wherein the providing a substrate includes providing a substrate having a layer stack including multiple semiconductor channel layers separated from each other by a respective intermediate layer, and the forming a plurality of core channel structures includes forming multiple core channel structures from the multiple semiconductor channel layers respectively, the multiple core channel structures each having a vertical conductive path relative to a surface of the substrate and including the first and second core channel structures and at least one third channel structure vertically stacked on the substrate and separated by isolation structures formed from the respective intermediate layers, wherein each isolation structure is formed from a wafer bonding interface or a replacement insulation material which replaces the intermediate layer.

A twelfth exemplary aspect is a method of microfabrication of a transistor device, the method including forming channel structures on a substrate from a layer stack, the channel structures each having a vertical conductive path relative to a surface of the substrate, the channel structures including a vertical stack of two or more levels of channel structures, and forming shells around channel structures in at least one of the levels of channel structures by epitaxial growth such that each of the shells is part of a respective transistor channel of a corresponding transistor to be formed in the at least one of the levels of channel structures.

A thirteenth exemplary aspect is wherein the forming shells includes covering one or more first levels of channel structures with a dielectric while one or more second levels of channel structures are uncovered, and forming the shells as first shells around each uncovered channel structure from the one or more second levels of channel structures, the first shells each being formed by epitaxial growth and being part of a transistor channel structure for a corresponding transistor to be formed.

A fourteenth exemplary aspect further includes covering the first shells while uncovering the one or more first levels of channel structures, and forming second shells around uncovered channel structures from the one or more first levels of channel structures, each of the second shells being formed by epitaxial growth and being part of a respective transistor channel structure for a corresponding transistor to be formed.

A fifteenth exemplary aspect is wherein the forming shells includes forming shells around each the channel structures in each of the levels of channel structures by epitaxial growth such that each of the shells is part of a respective transistor channel of a corresponding transistor to be formed, covering one or more first levels of channel structures with a dielectric while one or more second levels of channel structures are uncovered, and removing the shells from channel structures of the one or more second levels of channel structures.

A sixteenth exemplary aspect further includes forming the layer stack by at least one of epitaxial growth and bonding two or more wafers.

A seventeenth exemplary aspect is a microfabricated transistor device including a vertical stack of two or more channels of field effect transistors on a semiconductor substrate, each of the channels having a vertical conductive path relative to a surface of the semiconductor substrate, at least one of the channels including a shell formed around a core material, the shell including epitaxial material.

An eighteenth exemplary aspect is wherein each of the channels including a shell formed around a core material, each of the shells including epitaxial material.

A nineteenth exemplary aspect is wherein the two or more channels of the vertical stack are separated from each other by an isolator.

A twentieth exemplary aspect is wherein the vertical stack includes a channel for a PMOS field effect transistor, and a channel for an NMOS field effect transistor.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIGS. 3A, 3B, 3C, 3D, 3E, 3F, 3G, 3H, and 3I illustrate intermediate structures in a process for forming a 3D transistor stack in accordance with one embodiment of the disclosure;

FIG. 8 illustrates 3D vertical field effect transistor stack formed from multiple wafers.

DETAILED DESCRIPTION

Figure 1:
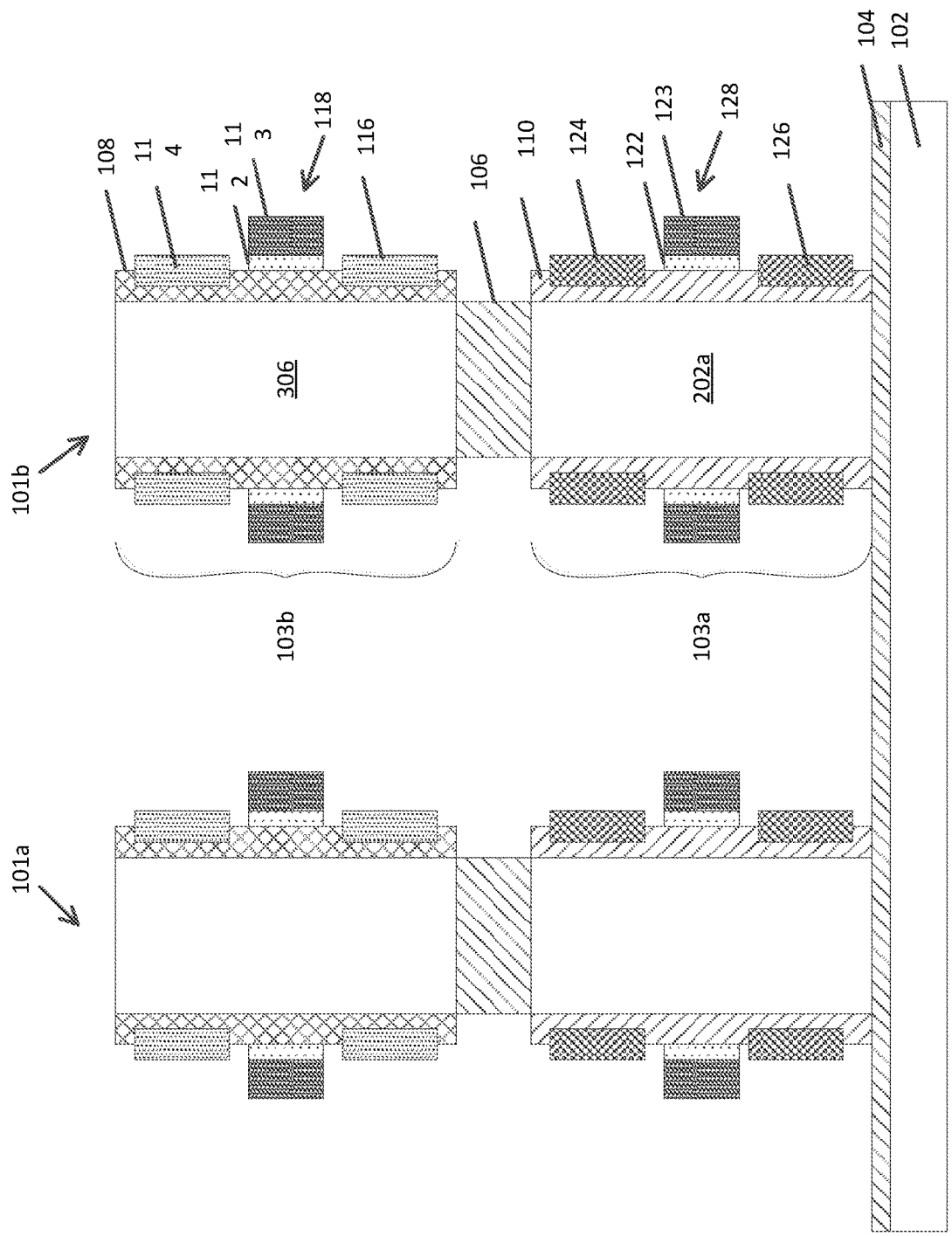
FIG. 1 illustrates a cut out view of an example vertical field effect transistor in accordance with one embodiment of the disclosure.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

While 2D semiconductor technology is approaching 3 nm nodes, and possibly 2 nm nodes, 3D semiconductor technology offers high performance for a smaller footprint. 3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein include cost-effective processes for forming vertical channel transistors with shells grown by epitaxy. By starting with a common semiconductor core for 3D transistors, epitaxial material is selectively grown vertically thereby creating an optimum material channel formation. This technique provides a significant mobility boost because material type can be varied for each channel, for vertically stacked NMOS and PMOS devices. Two or more bonded wafers can be used herein after 3D vertical nano sheets are grown for each wafer. This provides 360 degree rotational symmetry prior to patterning the 3D transistors (i.e. no restrictions on alignment tolerances). Techniques herein may be used in both 3D side-by-side CMOS and also CFET CMOS designs. Also, combinations of side-by-side and CFET can be realized, as well as stacks of a couple of transistors or many transistors in a vertical stack. The epitaxial shell/core herein can be used to customize sections of the vertical channel for the device needs of each section. Examples include many elements disclosed herein, though many more combinations are possible. Devices herein have no thickness constraint for the epitaxial shell because of a 360 degree channel is formed for vertical nanosheets. Moreover, a robust, vertical diffusion break between the sections of the vertical channel is enabled with these techniques.

Techniques herein of transistors with epitaxial (epi) shells include many example embodiments. This enables higher density circuits to be produced at reduced cost. By starting with a common semiconductor core for 3D transistors, a shell of epi (or a stack of epi shells) may be selectively grown vertically (relative to wafer surface) to create an optimum material channel formation. This can provide a significant mobility boost because the material type is optimized for NMOS and PMOS devices. Diffusion break and isolation is achieved with vertical nanosheets spaced apart in the z-direction. 360 degree symmetry is achieved (i.e. stack of wafers with nanosheets) without using precise alignment between wafer stacks.

Figure 2:
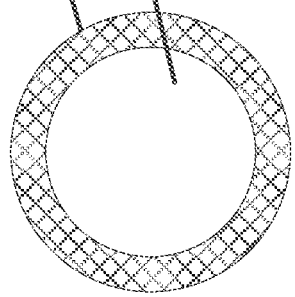
FIG. 2 illustrates a top view of the transistor stack of FIG. 1.

FIGS. 1 and 2 illustrate one example of a vertical 3D transistor stack in accordance with an exemplary aspect of the disclosure. FIG. 1 illustrates a cut out view of a vertical field effect transistor with one epitaxial shell with a first material and another epitaxial shell with a second material. FIG. 2 is a top planar view of the structure of FIG. 1. The exemplary structure includes two adjacent vertical 3D transistor stacks 101a and 101b on a substrate 102 having a dielectric layer 104. In the example of FIGS. 1 and 2, each of the stacks 101a and 101b have the same structure. For purposes of explanation, only transistor stack 101b is described.

As seen, the transistor stack 101b includes a lower 3D vertical transistor 103a and an upper 3D vertical transistor 103b separated by vertical isolation (also known as a vertical diffusion break) 106. Additional transistors separated by vertical isolation may be included in the stacks 101a and/or 101b. Lower transistor 103a includes a vertical semiconductor core (also known as a channel structure) 202a, epitaxial shell (also known as epi shell) 110, source/drain regions (also known as S/D regions) 124 and 126, and gate stack 128. Vertical semiconductor core 202a and/or epitaxial shell 110 serve as the transistor channel providing a vertical current path (relative to the surface of the substrate 102) between S/D regions 124 and 126. As discussed further below, semiconductor core 202a may be epitaxially grown. In the embodiment of FIGS. 1 and 2, the gate stack 128 includes gate dielectric 122 and gate conductor 123. Any known dielectric and conductor materials may be used in the gate stack 128, and additional gate stack layers may be included in the gate stack 128.

Upper transistor 103b similarly includes a vertical semiconductor core 306, epi shell 108, S/D regions 114 and 116, and gate stack 118. Vertical semiconductor core 306 and/or epitaxial shell 108 serve as the transistor channel providing a vertical current path (relative to the surface of the substrate 102) between S/D regions 114 and 116. Semiconductor core 306 may be epitaxially grown, and the gate stack 118 includes gate dielectric 112 and gate conductor 113. Any suitable dielectric and conductor materials may be used in the gate stack 128, and additional gate stack layers may be included in the gate stack 128. Further, any suitable dielectric may be used for the vertical isolation 106.

The lower 3D vertical transistor 103a and upper 3D vertical transistor 103b may be the same or different types. That is, the vertical 3D transistor stack 101b may include all PMOS devices, all NMOS devices, or mix of both PMOS and NMOS devices. While the example of FIGS. 1 and 2 show the lower 3D vertical transistor 103a and upper 3D vertical transistor 103b each including an epi shell, one of the transistors may have no epi shell and use the semiconductor core 202a or 306 as a transistor channel. That is, the vertical 3D transistor stack 101b may include a plurality of transistors each having an epi shell, or a mixture of transistors with and without epi shells.

As noted above the vertical semiconductor cores 202a, 306 and epi shells 110, 108 may be epitaxially grown. The epi materials may be any of 12 Elements (from group III, IV, and V) of the periodic table can be used herein for core epi or shell epi and any combinations thereof. Group III includes boron (B), aluminum (Al), gallium (Ga), and indium (In). Group IV includes carbon (C), silicon (Si), germanium (Ge), and tin (Sn). Group V includes nitrogen (N), phosphorus (P), arsenic (As), and antimony (Sb). Stand alone epi cores or shells grown on epi cores can include, for example, Si, $Si_xC_y$, Ge, $Si_xGe_y$, $Ge_xSn_y$, (additionally column IV can contain 2 elements in epi grown column IV, examples are SiC, SiGe, GeSn, GeC, SnC, SiSn for either epi cores or epi shells).

Some epi stacks examples on epi cores include—(1) Si, $Si_{x1}Ge_{x1}$, Ge; (2) $Si_{x1}Ge_{yx}$, Si; (3) Si, SiC, (4) Ge, $Ge_xSn_y$, (5) Si, $Si_xGe_y$, GaB (6) Si, $Si_xGe_y$, GaN. Other epi cores or epi shells are vertical Nano sheet layers that may be in situ epi doped (either as the core or the epi shell) or doped with either col III or col V combined with col IV SiAs, SiP, SiSb, SiIn, SiGa, SiB, SiGaB, GeAs, GeP, GeSb, GeIn, GeB, SiCAs, SiCP, SiCAs, SiCSb, SiCIn, SiCB, also GexSny with insitu doping of As, P, Sb, In, Ga, B as examples. Other epi shells that may be used with Si and Ge cores include —GaAs, InP, GaP, GaN, InGaAs using a transition epi layer (using pairs for III, V). Note that a given epi shell/core epi shell herein can be used to customize each stacked channel for the device needs. Not all combinations are listed with the 12 elements shown. As can be appreciated, other combinations are contemplated herein.

Dielectrics as used herein are typically an oxide such as silicon dioxide. The vertical isolation between device regions as used herein is a dielectric. In some cases where device dimensions are critical, a high-k dielectric may be used. Examples of high-k dielectrics include oxynitride, halfnium dioxide, halfnium silicate, zirconium silicate, and zirconium dioxide.

The channel cores 202a, 306 can be different shapes and sizes, which is useful for different types of devices. FIG. 2 illustrates a top view of the transistor stack of FIG. 1 within a dielectric 150 (with the gate stacks covered by the dielectric 150). Channel cores 202a, 306 herein can be hollowed and filled with metal, or may be of silicon, or an epitaxial material. Also a horizontal cross-sectional shape of the cores 202a, 306 can be circular as shown in FIG. 2, rectangular, or other shape. A epi shell 108, 110 may be formed on a surface of the respective cores 202a, 306. Different diameters or widths can be formed for different device designs.

The remaining figures include five example flows for various embodiments, Process Flow A, Process Flow B, Process Flow C, Process Flow D, and Process Flow E.

Figure 3A:
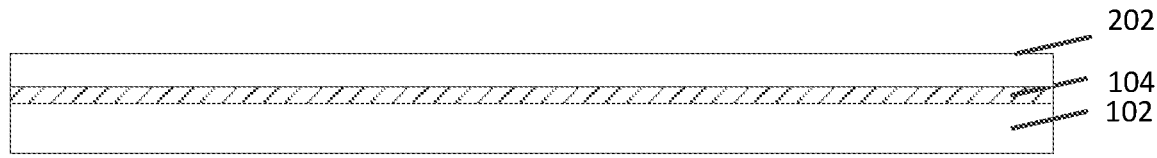
Figure 3B:
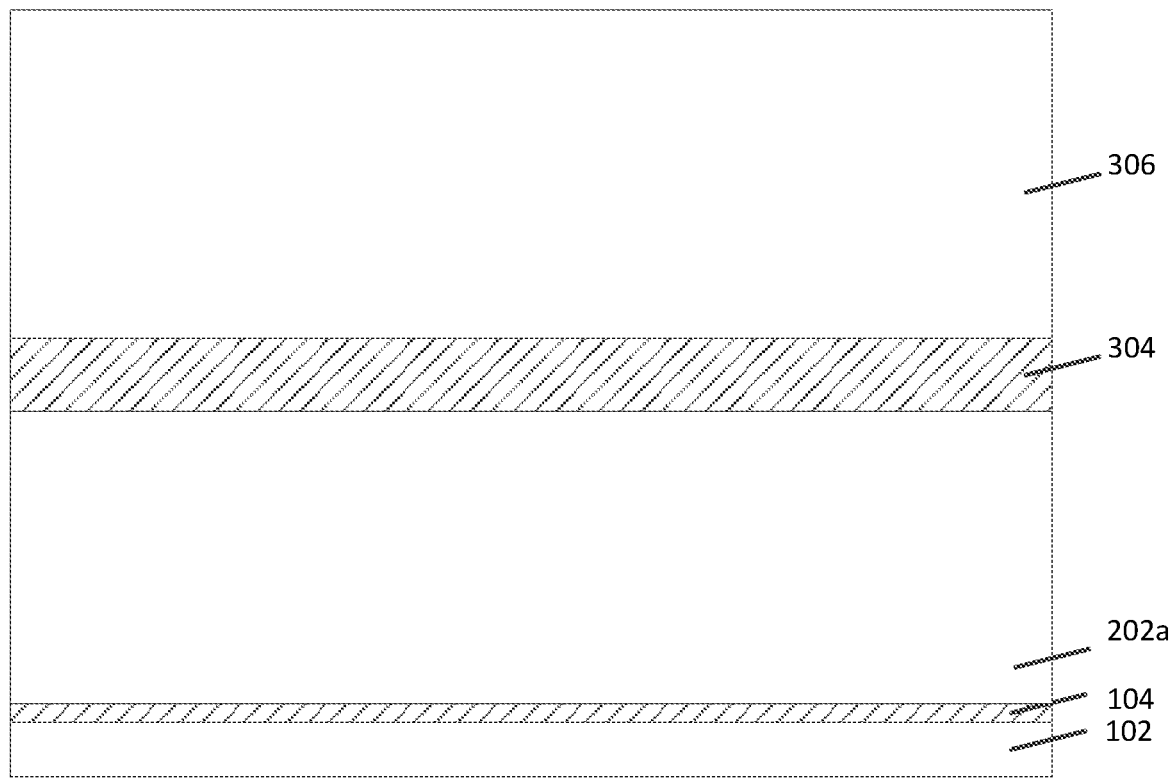
Figure 3C:
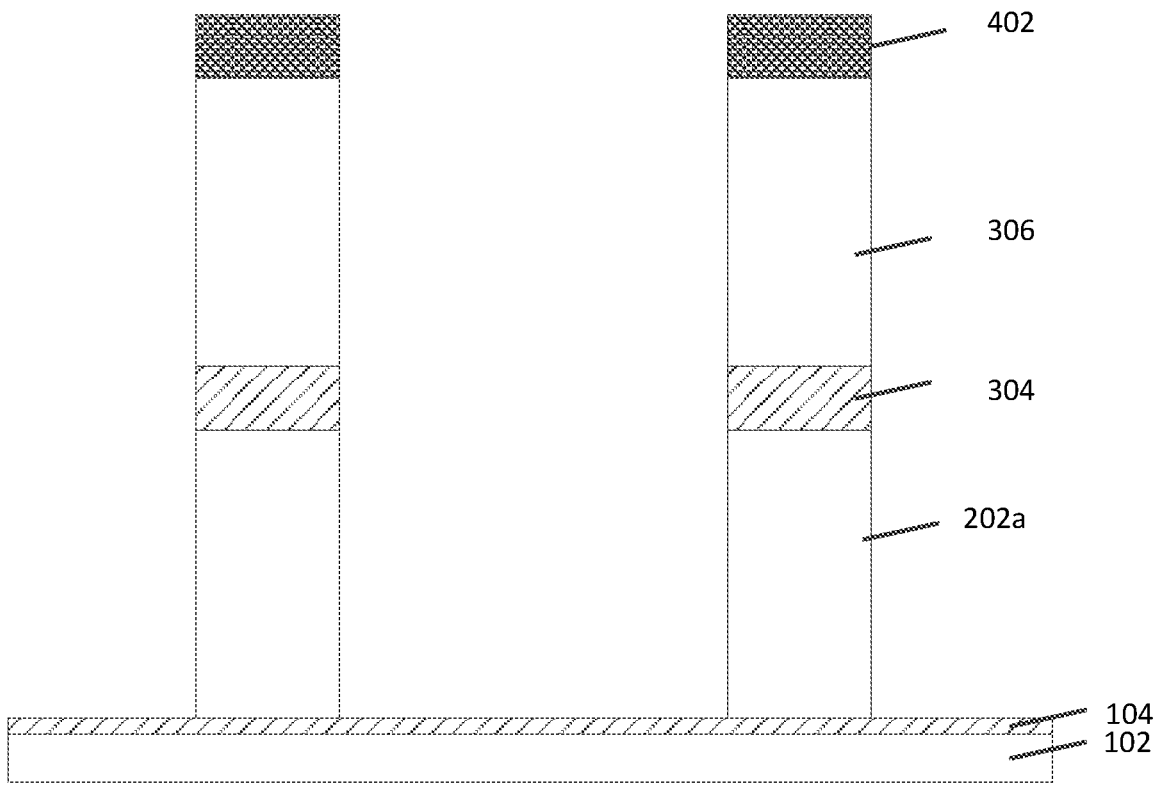
Figure 3D:
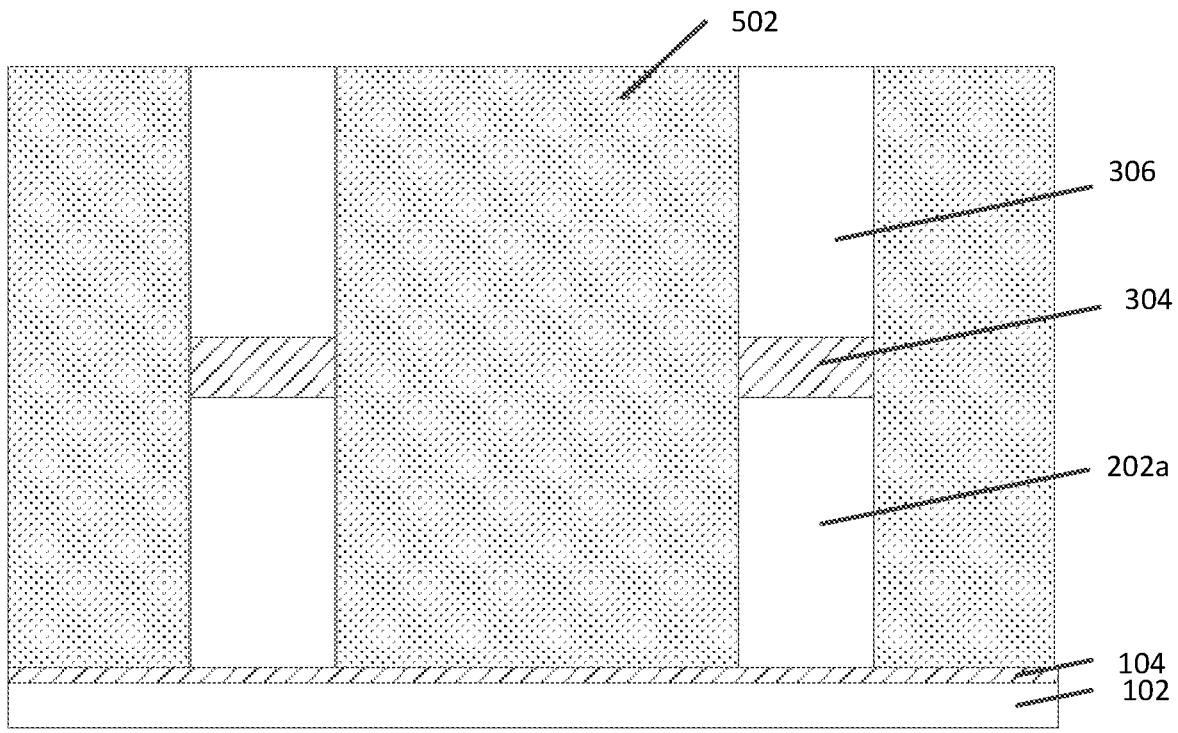

In an embodiment, a 3D vertical nano sheet device may be formed with one epi shell on a vertical 3D transistor stack, such that one other transistor is a core epi transistor. Process Flow A (FIGS. 3A-3I) shows forming a structure for a 3D VFET one epi (epitaxial) shell on vertical 3D transistor stack, one core epi transistor, with N=2 transistors. A starting substrate or wafer can be a silicon 102/dielectric 104/silicon 202 wafer as shown in FIG. 3A. In FIG. 3B, a layered epitaxy stack of Si 202*a*/SiGe 304/Si 306 is grown on the substrate or wafer.

Figure 3E:
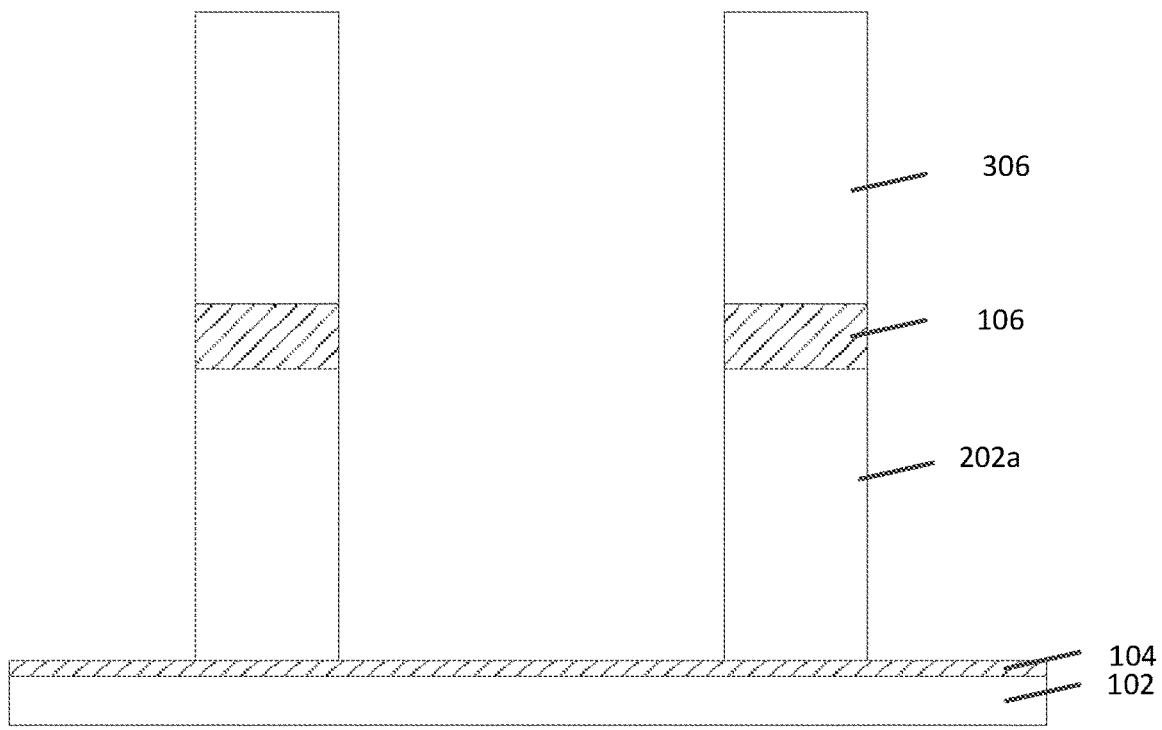
Figure 3F:
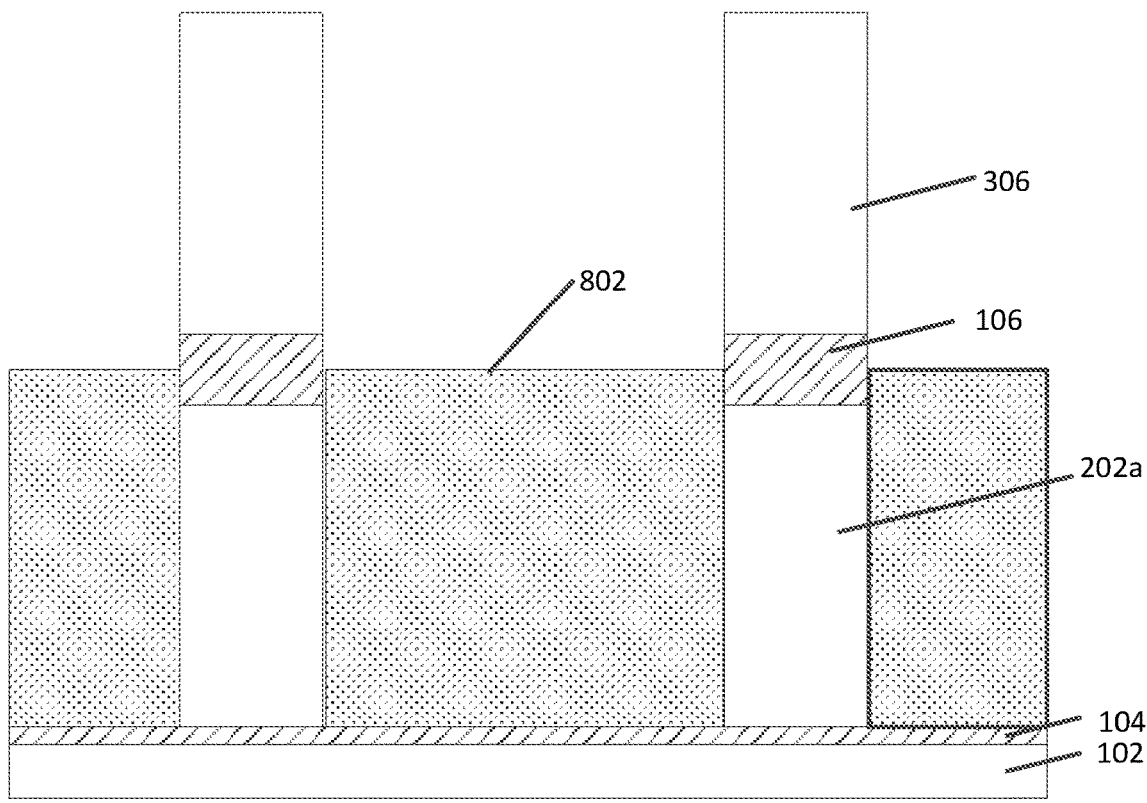

In the embodiment of FIGS. 3A-3I, channel structures are formed on the substrate or wafer from the layered epi stack, the channel structures having a vertical conductive path relative to a surface of the substrate. The channel structures include a vertical stack of two or more levels of channel structures. A photoresist etch mask 402 can be used for etching the layer stack to form resulting channel structures shown in FIG. 3C. The photoresist etch mask 402 may be a matrix pattern of circles, squares, rectangles, or other shapes to accommodate transistor structures along the sides of resulting vertical channel cores as needed. The vertical channel cores take the shape of a cylinder or rectangular column. The etch mask 402 can be removed, followed by dielectric deposition 502 and chemical-mechanical planarization (CMP) to provide the structure in FIG. 3D. Device structures or elements can be isolated, by making replacing the SiGe portion 304 of the stack with a dielectric material to form vertical isolation 106 for two device silicon regions as shown in FIG. 3E. Techniques for forming the isolation region are disclosed in U.S. patent application Ser. No. 17/094,947 "Method of Making 3D Isolation" filed Nov. 11, 2020, the entire content of which is incorporated herein by reference.

Figure 3G:
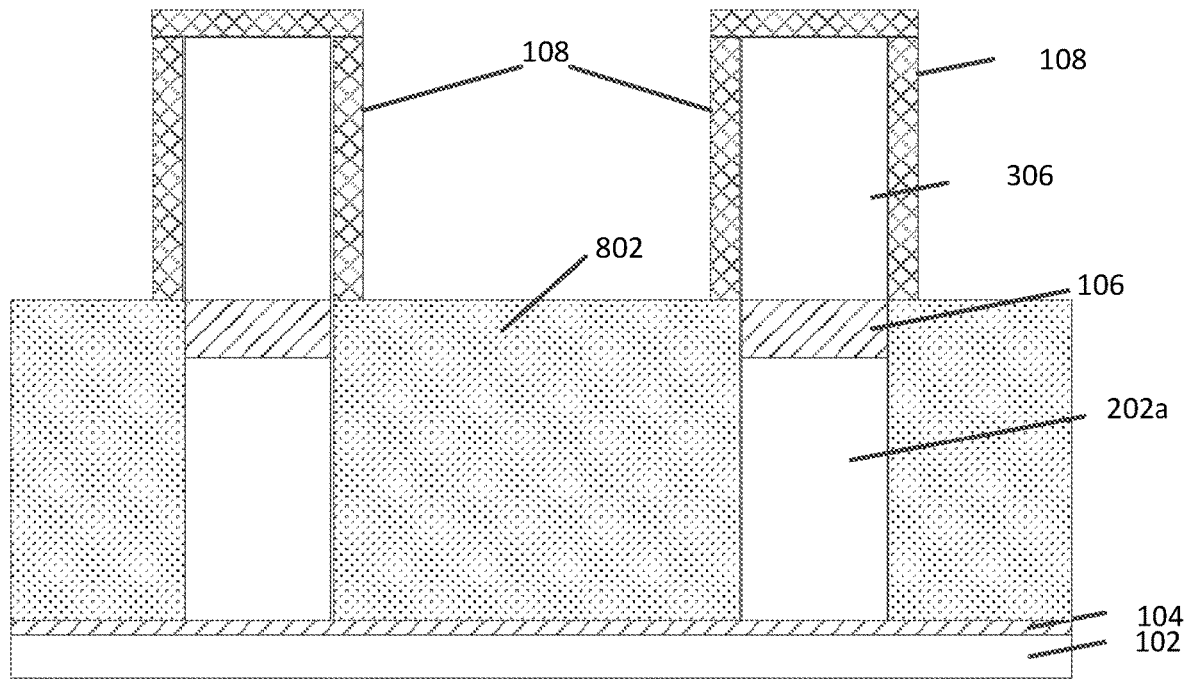
Figure 3H:
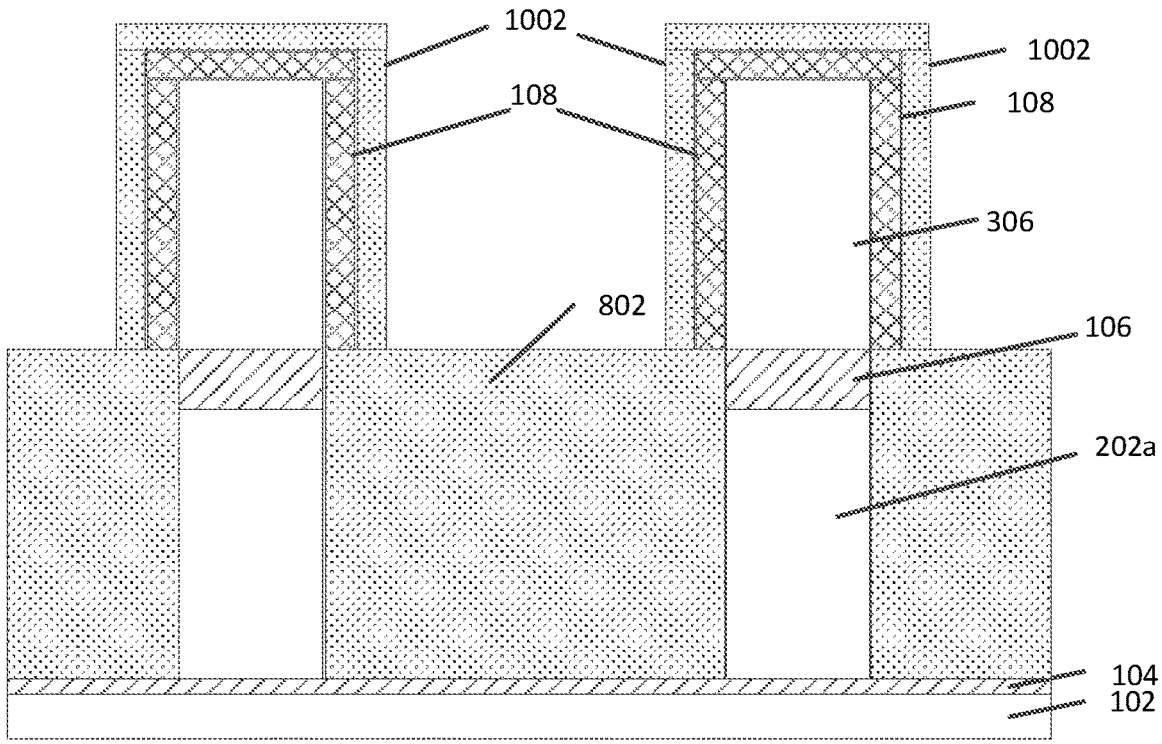

FIG. 3E shows the process flow after intrinsic core (or P+ or N+ doped core) of silicon is completed through the 3D isolation step. A dielectric 802 deposition is followed by CMP and then an etch back or controlled depth etch to uncover the top silicon region 306 to provide the structure of FIG. 3E. The dielectric 802 may be a different material compared to material for vertical isolation 106. Si$_x$Ge$_y$ epi shell 108 is then grown on upper 3D vertical transistor (uncovered semiconductor portion 306) for future PMOS regions as shown in FIG. 3G. The epi shell 108 is formed around the core 306 of the uncovered semiconductor portion 306. Then the epi shell is covered by a selective dielectric 1002 deposition or growth to protect SiGe regions 108 as shown in FIG. 3H. In FIG. 3I, dielectric 802 and dielectric 1002 are removed. At this point, two types of vertical channel regions and S/D regions are defined in order to form a stack of NMOS and PMOS transistors. Thus, in the embodiment of FIGS. 3A-3I, the lower vertical transistor uses the semiconductor core 202*a* as its transistor channel structure, while the upper vertical transistor uses epi shell 108 as a portion of its transistor channel structure. S/D regions and gate stacks may then be formed on the semiconductor core 202*a* and epi shell 108 to provide completed transistors similar to those shown in FIG. 1.

Figure 4:
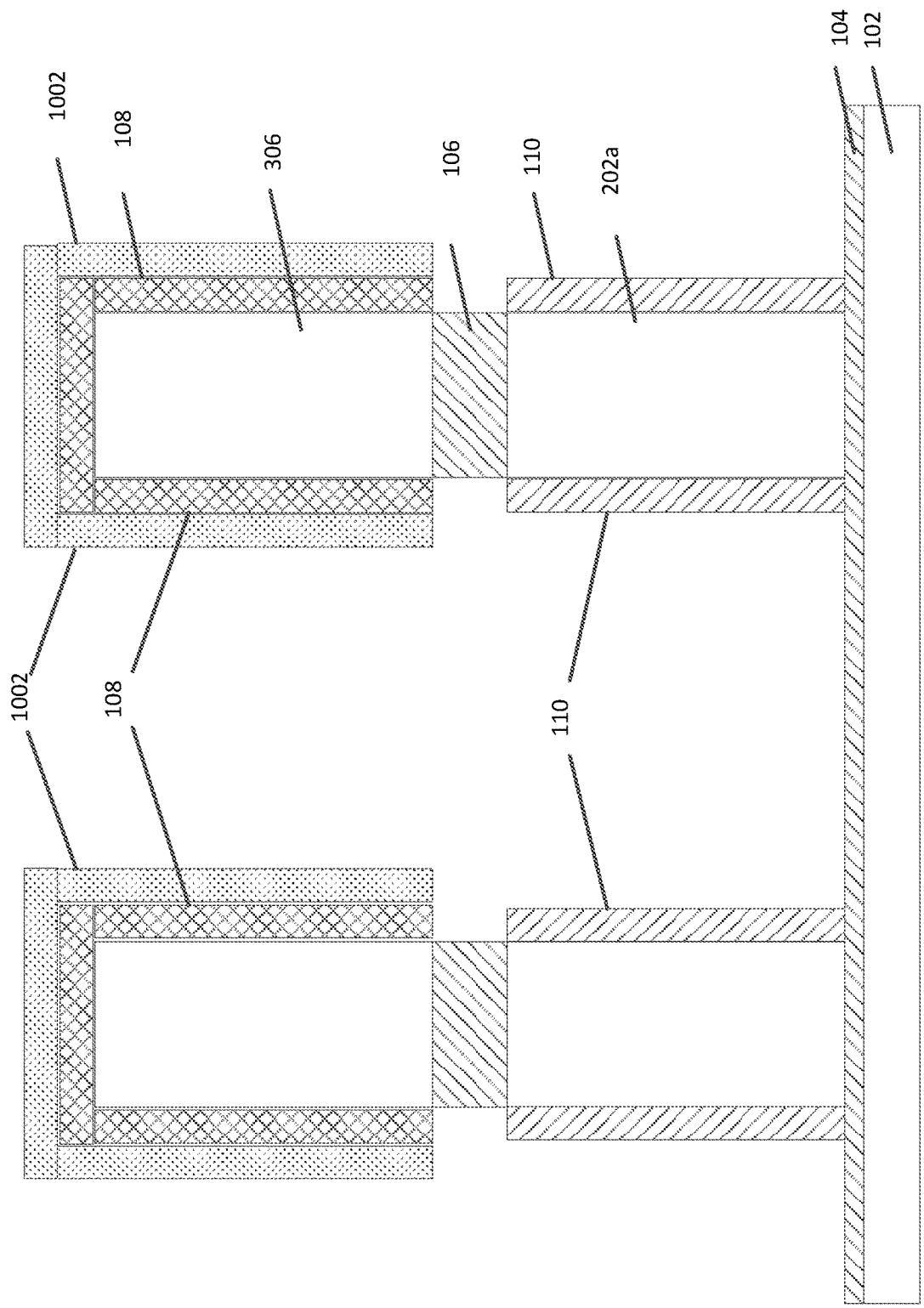
FIG. 4 illustrates an intermediate structure in a process for forming a 3D transistor stack in accordance with another embodiment of the disclosure.

Process Flow B provides a 3D vertical field effect transistor (3D VFET) having one epi shell with material 1 (PMOS), and another epi shell with material 2 (NMOS) with N=2 transistors. Process Flow B begins in a similar manner as Process Flow A but includes an additional step as shown in FIG. 4. After completing the steps shown in FIGS. 3A-3H, dielectric 802 is removed followed by epi shell 110 formation of Ge or SiC formed around a lower region of flow channels for the lower NMOS transistors as seen in FIG. 4. Dielectric 1002 can be removed and NMOS and PMOS gate electrode and S/D regions can be completed to form the vertical transistor stacks as seen in FIG. 1.

Figure 5A:
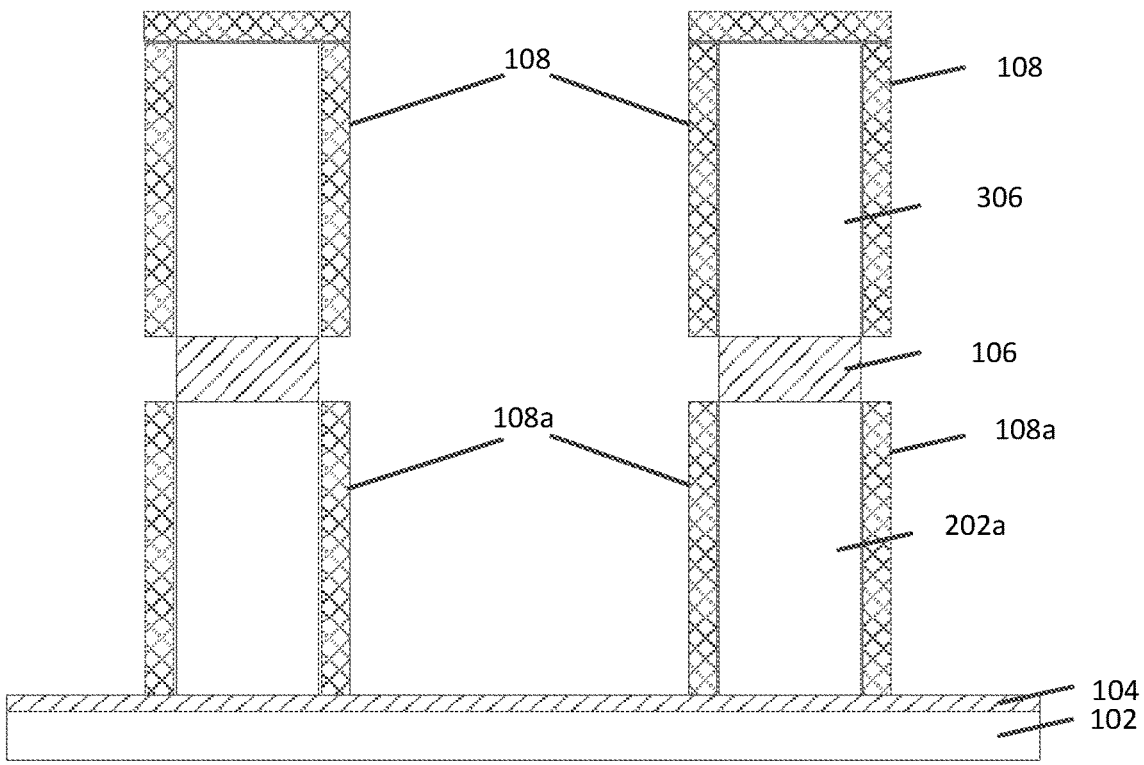
FIGS. 5A, 5B, 5C and 5D illustrate intermediate structures in a process for forming a 3D transistor stack in accordance with another embodiment of the disclosure.
Figure 5B:
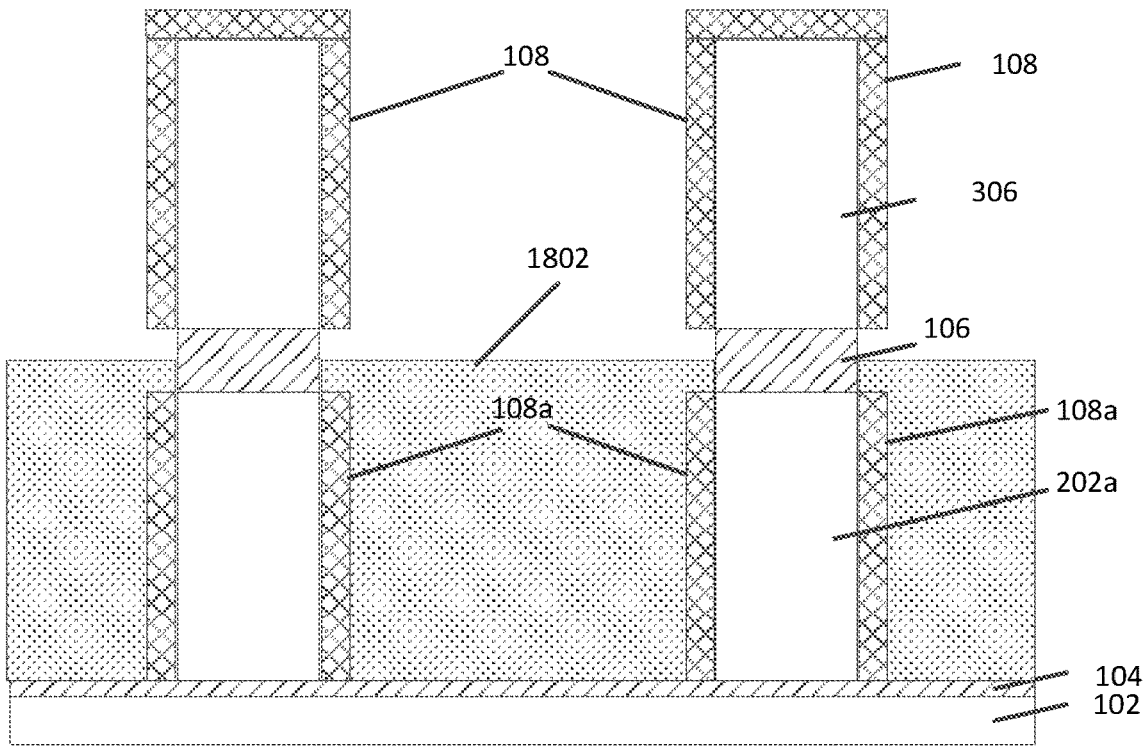
Figure 5C:
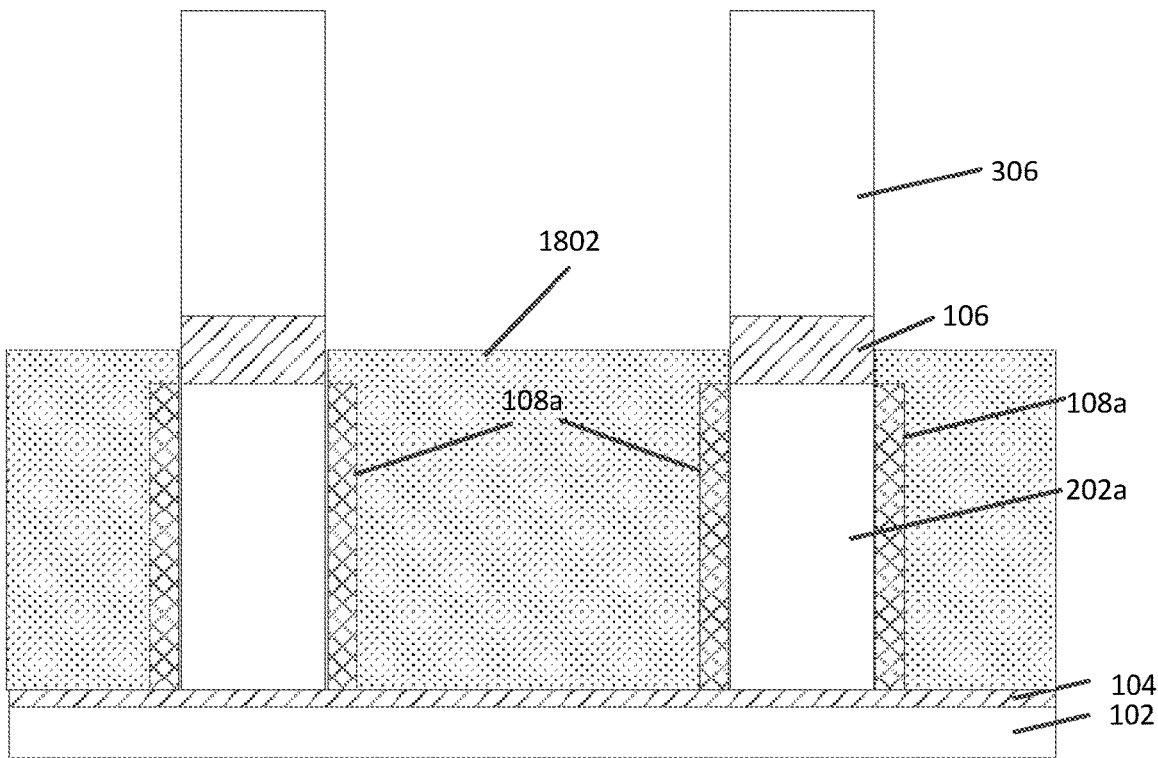
Figure 5D:
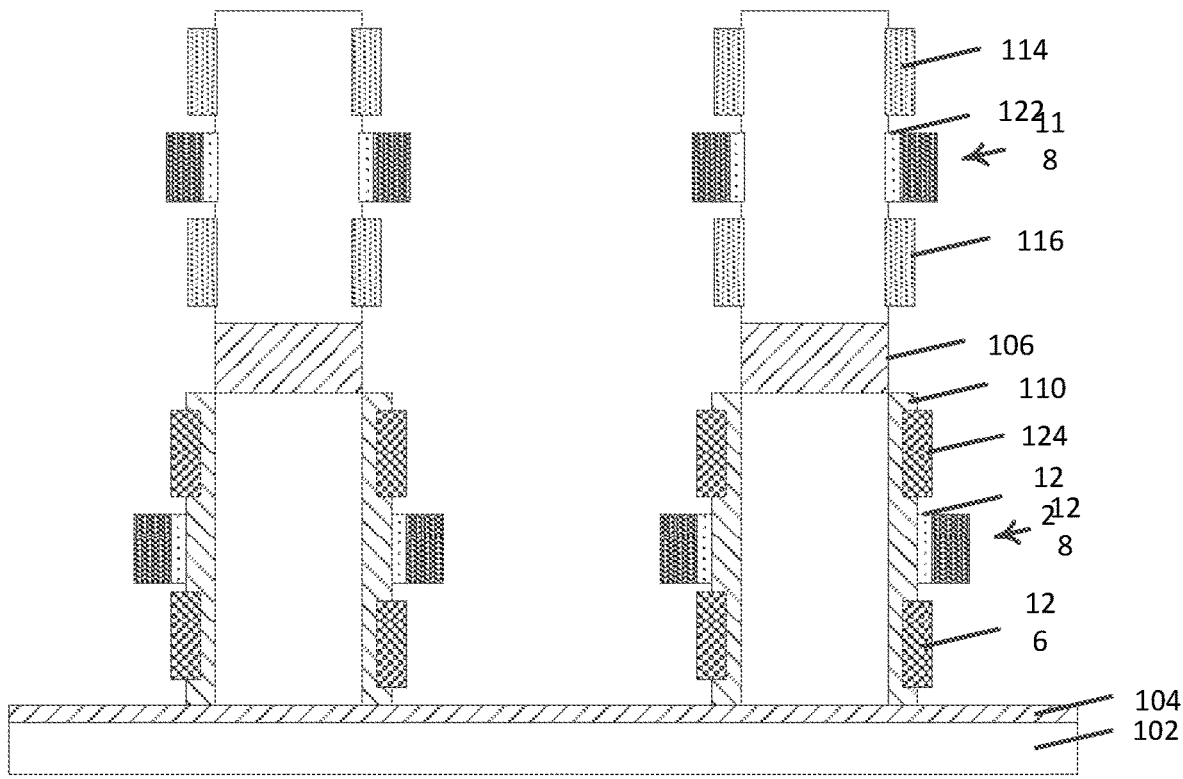

Process Flow C (FIGS. 5A-5D) shows a 3D VFET having one epi shell for one transistor using a disposable SiGe epi shell such that only PMOS gets the Si$_x$Ge$_y$ epi shell. Process Flow C begins in a similar manner as Process Flow A. The steps shown in FIGS. 3A-3H provide stacked vertical flow channels after intrinsic core (or doped core) of silicon is completed through 3D isolation. In FIG. 5A, a SiGe epi shells 108, 108*a* are formed around flow channels to cover both NMOS and PMOS regions. Note that the SiGe shell will be removed in NMOS regions in a later step. In FIG. 5B, a dielectric 1802 deposition covers the bottom portion (PMOS regions). In FIG. 5C, the Si$_x$Ge$_y$ 108 is removed from top regions for future NMOS devices. Thus, in the example of FIGS. 5A-5D, the lower vertical transistor includes an epi shell as part of its channel structure, while the upper vertical transistor uses only the semiconductor core 306 as its channel structure. S/D regions 114, 116, 124, 126 and gate stacks 118 and 128 may then be formed to provide completed vertical transistors as shown in FIG. 5D.

The process flows described in FIGS. 3-5 above may be adopted for fabrication of vertical Nano sheets, for example. Each of these process flows provide the initial transistor cores or channel structures of the vertical transistor stack by sequential epitaxial growth of silicon containing materials on a substrate as described in FIGS. 3A-3F. In other embodiments, the initial transistor cores or channel structures of the vertical transistor stack may be provided by wafer bonding separate wafers. Process Flow D (FIGS. 6A-6G) shows bonding of two or more wafers to make vertical Nano sheet with dual epi shell crystal shells starting with Si/SiGe/Ge for PMOS and Si for NMOS 3D nanoplanes on each wafer (N=1 transistors per wafer). N=2 for the 2 wafer bonded example. This can be a CFET or any other combinations n-on-n, p-on-p or combinations. A single epi shell is also contemplated for PMOS. This flow provides a vertical diffusion break as part of the bonding process which is coupled with isolation to greatly simplify cost and integration with the vertical nano sheet.

Figure 6A:
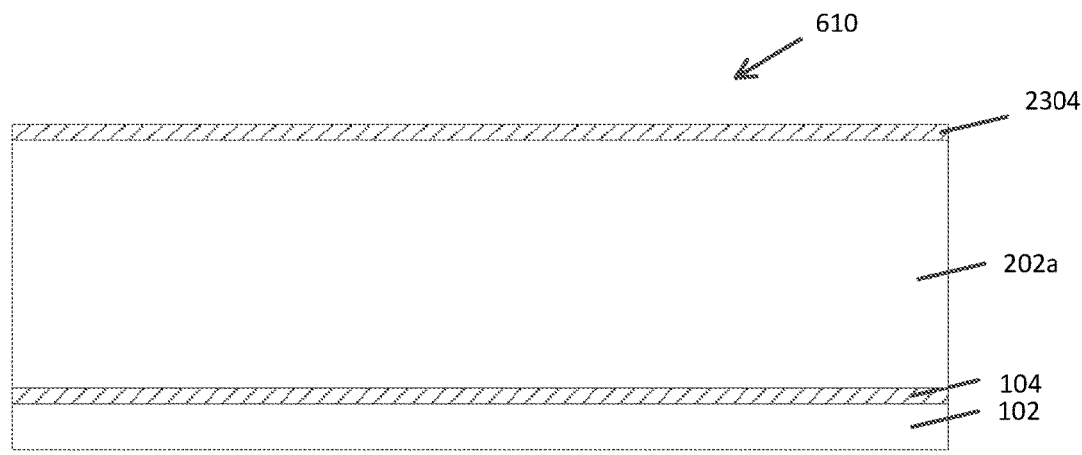
FIGS. 6A, 6B, 6C 6D, 6E, 6F and 6G illustrate intermediate structures in a process for forming a 3D transistor stack in accordance with another embodiment of the disclosure.
Figure 6B:
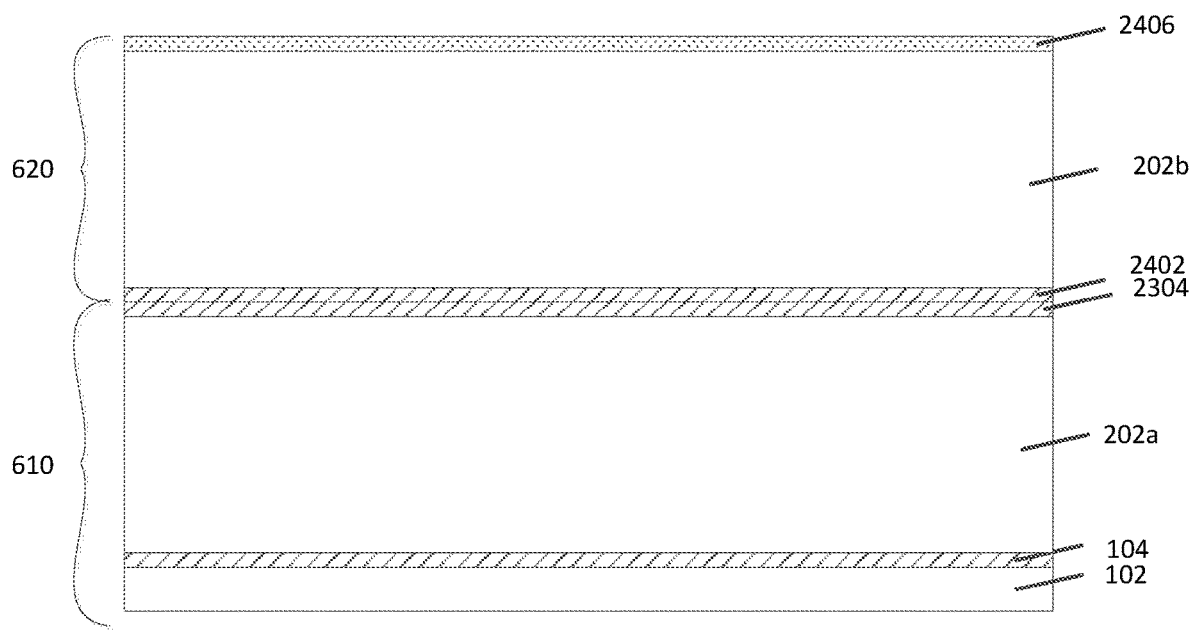

In FIG. 6A, a layer stack of nanosheets is formed of silicon Si or germanium Ge 202*a* on a first wafer 610. This example provides N=1 transistor stack, but N can be five, ten, or more layers high followed by dielectric capping layer 2304. Further, this particular example uses two bonding wafers, but the number of bonding wafers may be more than two. A second wafer 620 with a similar substrate stack is turned over and bonded to the first wafer 610 using a thin dielectric layer 2402 as the interface. Then a portion of the second silicon substrate 202*b* is removed followed by forming a cap layer 2406, which can be a hardmask material such as TiN to provide the structure of FIG. 6B. The wafer can be annealed (for example 400C) to bond the two bonding wafers 610, 620.

Figure 6C:
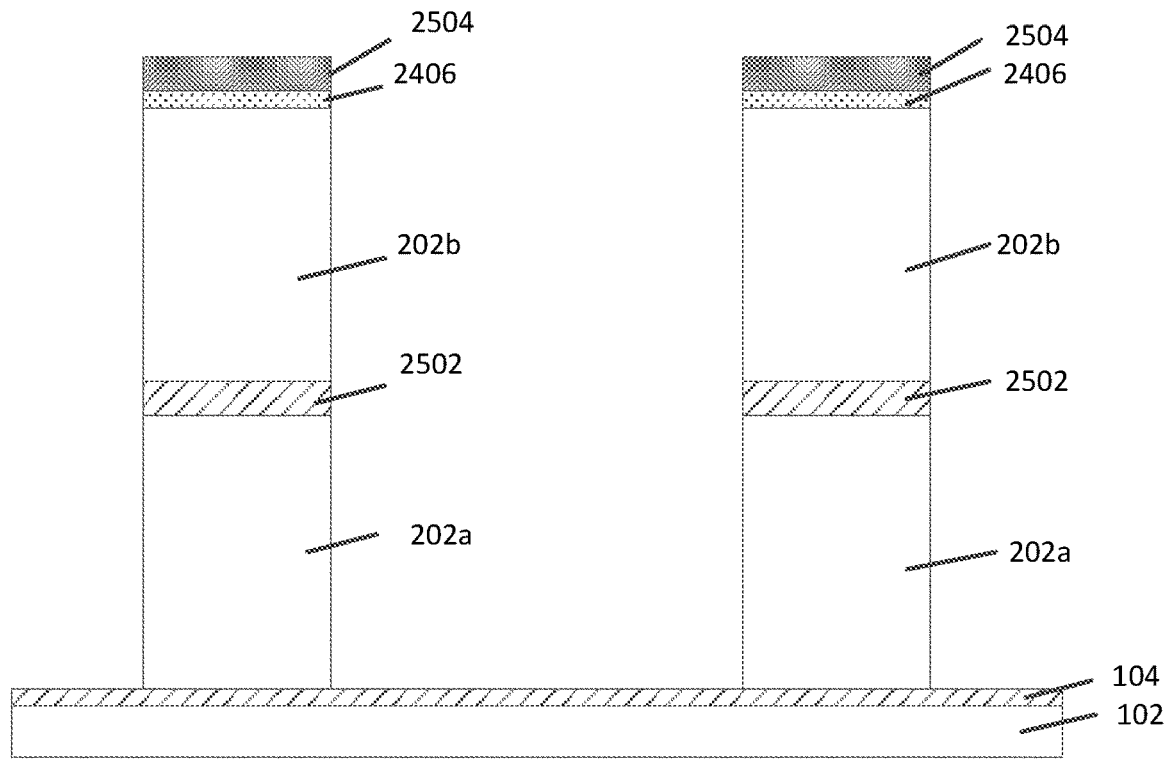
Figure 6D:
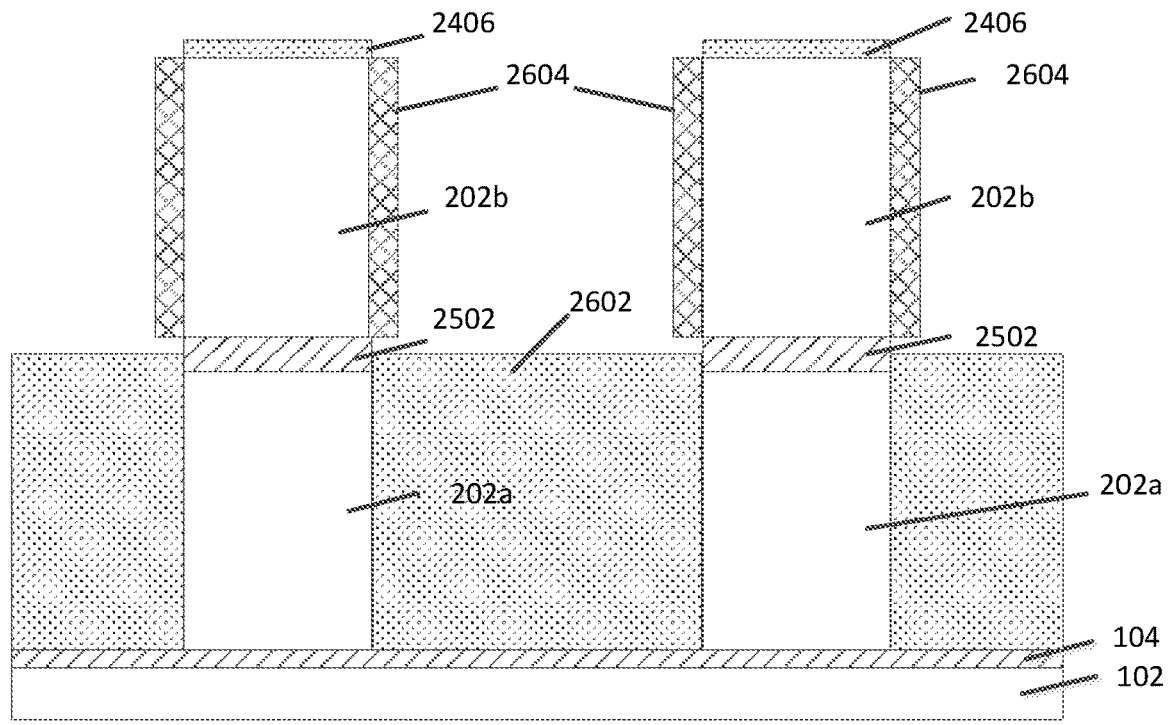

As seen in FIG. 6C, an etch mask 2504 is formed to pattern the channel structures which take the form of vertical nano sheets. As seen, bonding of the two wafers forms vertical diffusion break or vertical isolation 2502 between the upper and lower vertical transistors. In FIG. 6D, an oxide deposition 2602, CMP and etch process are executed to expose top one or top level transistors (in a two transistor stack). Then epitaxy shells of Si$_x$Ge$_y$ 2604 are grown around the channel structures 202*b*. This process includes growing shells of Si$_x$Ge$_y$ followed by Ge for PMOS devices. Alternatives include Si$_x$Ge$_y$ followed by Ge$_x$Sn$_y$ or any other PMOS compatible shell may be formed from the various combinations and elements previously described. Various combinations can be selected based on device requirements or performance specifications.

Figure 6E:
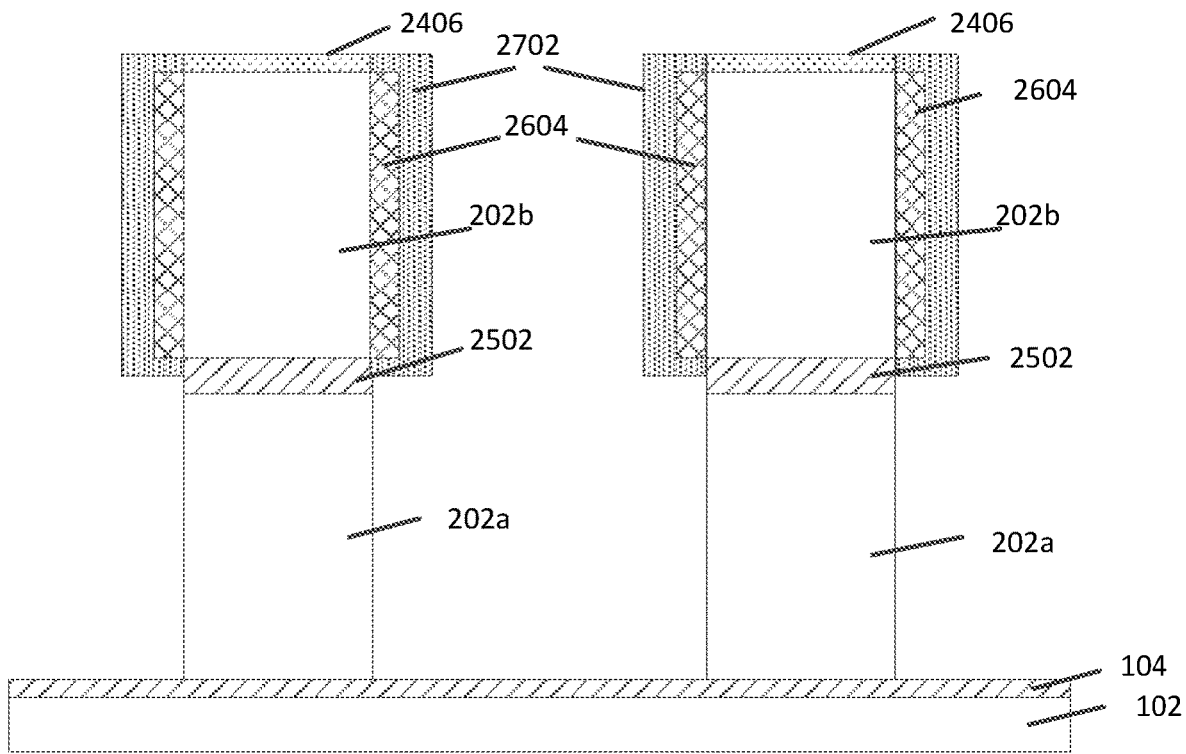
Figure 6F:
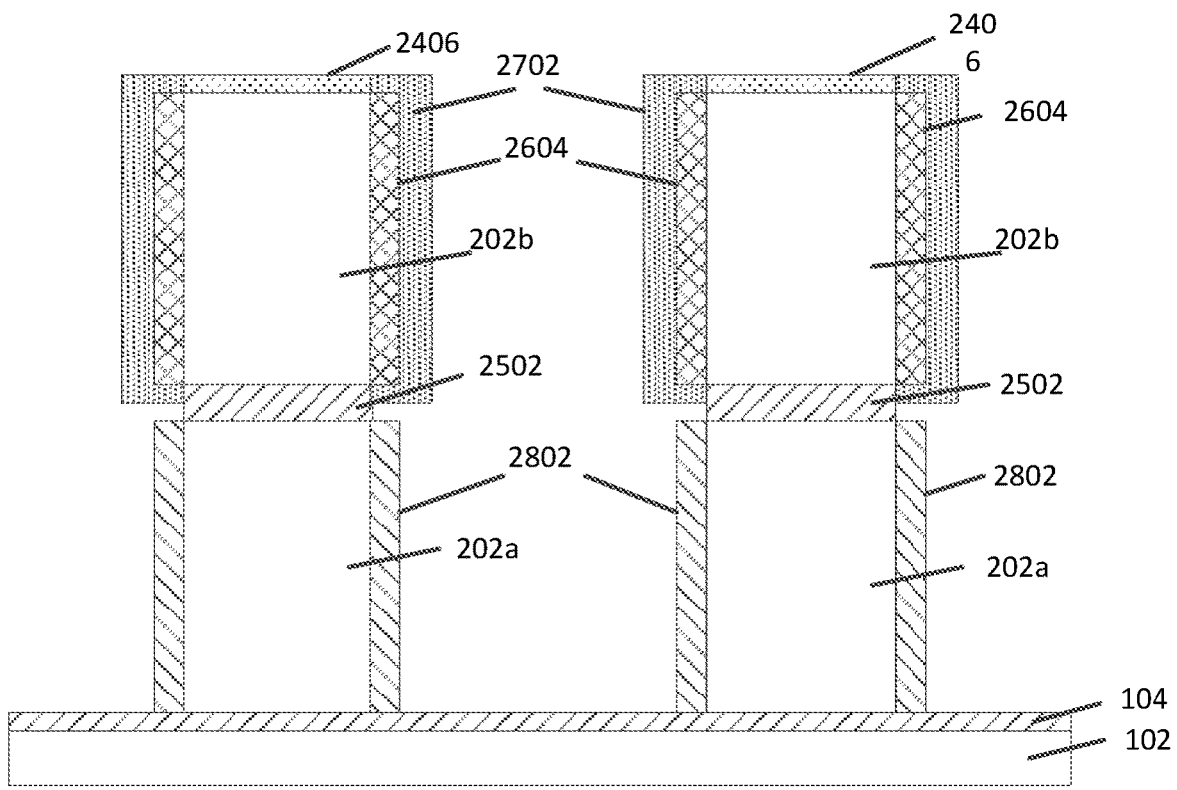
Figure 6G:
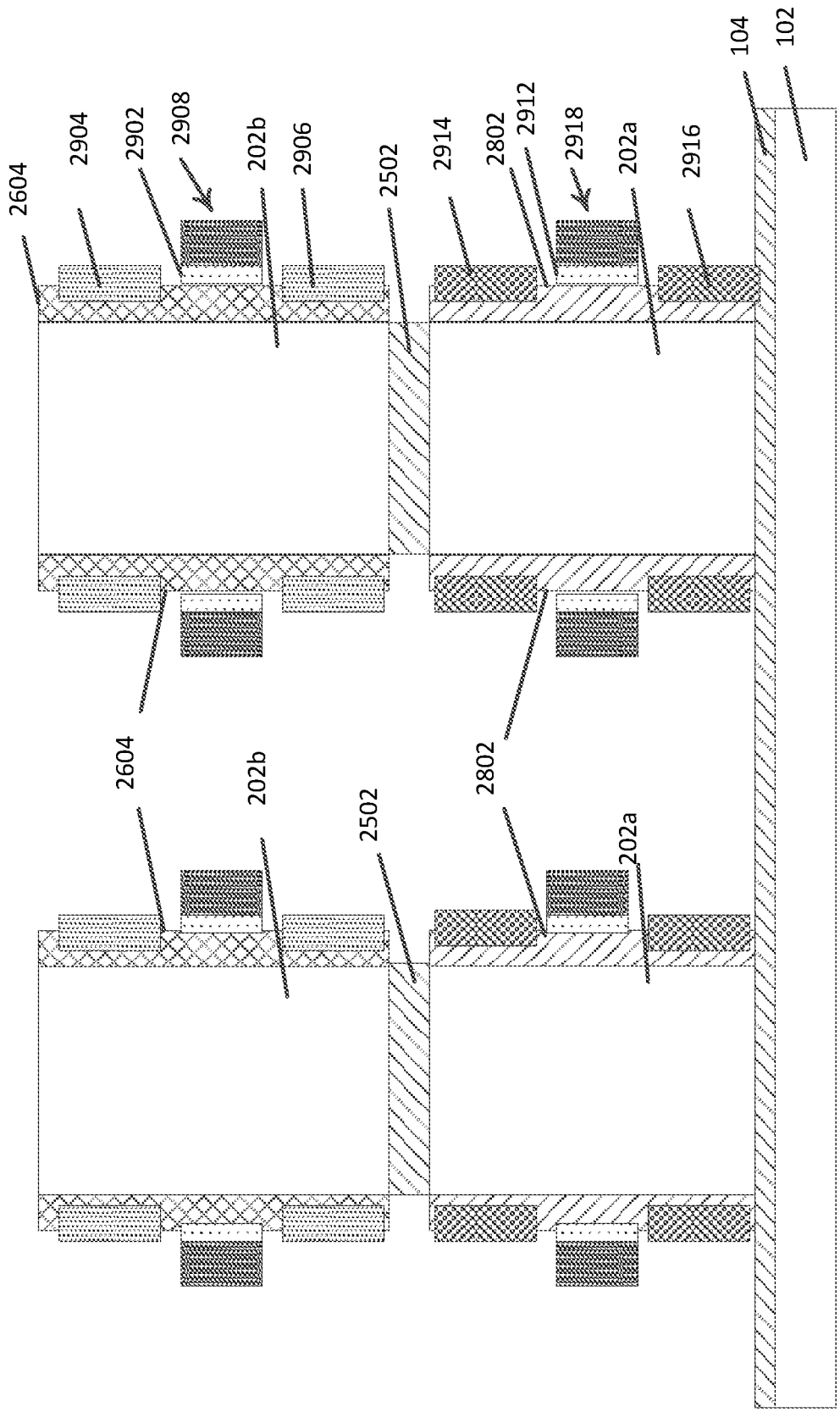
Figure 7:
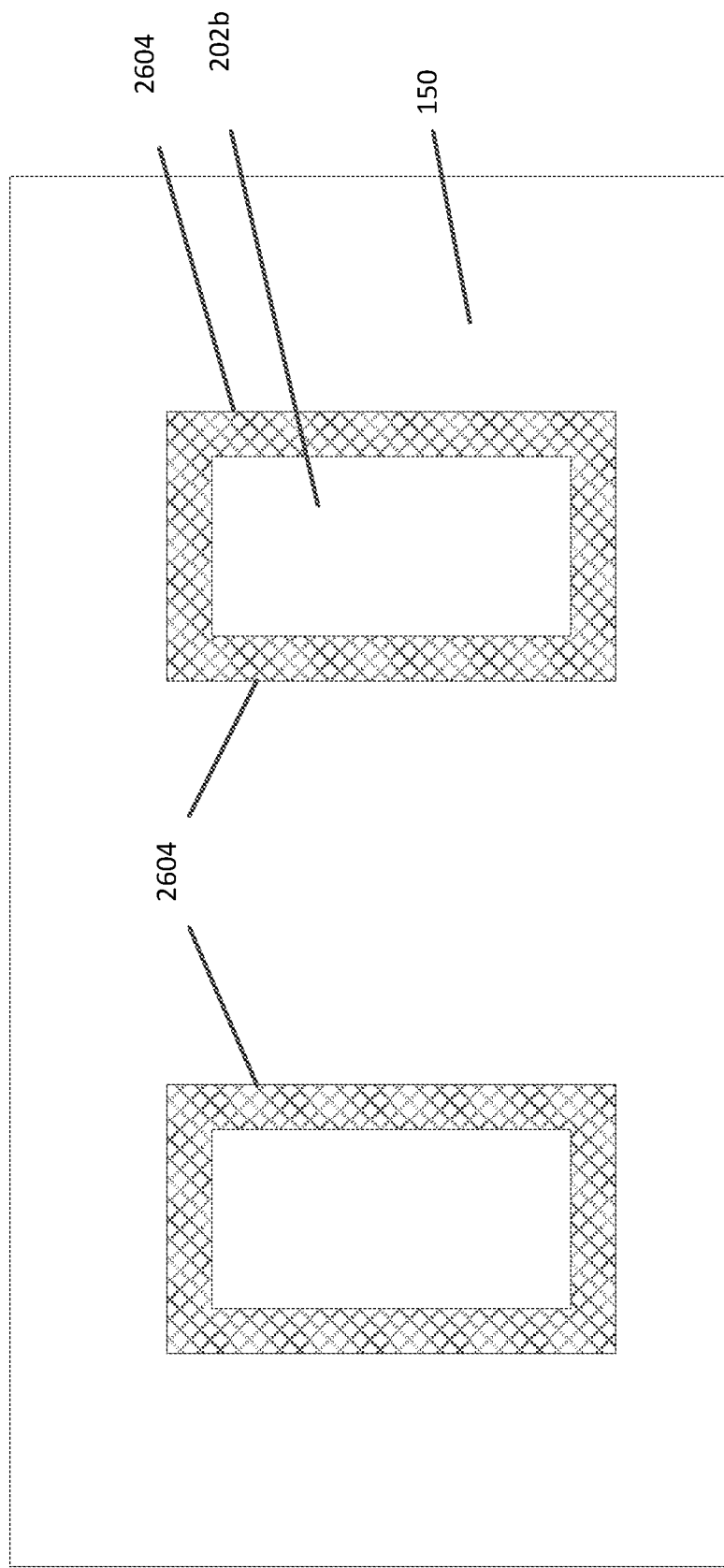
FIG. 7 illustrates a top view of the transistor stack of FIG. 29.

In FIG. 6E, a dielectric 2702 is selectively deposited to cover epi shells 2604 for PMOS devices, and then material covering the bottom transistors is removed. Then as shown in FIG. 6F, epi shells 2802 are grown around channel structures in the bottom tier for NMOS devices. For example, an epi shell 2802 of SiCP may be grown. Other options for epi shells include, but are not limited to, SiC, SiCAs, SiCSb, and so on, which can be based on performance designs. Dielectric 2702 can be removed and then the stack of vertical channel devices can have source/drain regions 2904, 2906, 2914, 2916 completed for a NMOS and a PMOS vertical nanosheet, such as for CFET as shown in FIG. 6G. The dielectric for the gate stack 2908, 2918 can include a high-k gate dielectric 2902, 2912. FIG. 7 illustrates a top view of the transistor stack of FIG. 6G with a surrounding dielectric 150 covering the gate stack. Channel cores 202*a*, 202*b* herein can be hollowed and filled with metal, or may be of silicon, or an epitaxial material. Also a horizontal cross-sectional shape of the cores 202*a*, 202*b* are rectangular, as a nano sheet. A epi shell 108, 110 may be formed on a surface of the respective cores 202*a*, 202*b*. Different widths can be formed for different devices. FIG. 8 illustrates how multiple vertical channel transistors with epi shells can be formed. In this example, four wafers are bonded that have a vertical isolation/diffusion break for each transistor with robust integration flow. As seen, vertical transistor stacks 801*a* and 801*b* each include four vertical channel transistors separated by vertical diffusion breaks. Each stack can be varied for NMOS/PMOS order resulting in N=4 transistors. Similarly, each stack can be varied for inclusion of an epi shell among transistors in the stack.

Process Flow E (FIGS. 9A-9G) shows bonding of two or more wafers to make vertical Nano sheets with dual epi crystal shells starting with Si/SiGe/Ge for PMOS and Si for NMOS 3D nanoplanes on each wafer (N=2 transistors per wafer). N=4 for the two-wafer bonded example. Note that N wafers can be bonded together prior to the etch of the 3D nanoplanes on each wafer. Also 360 degree rotational symmetry is achieved by bonding wafers prior to cutting 3D vertical nanoplanes (i.e. alignment precision is not an issue for techniques herein).

Figure 9A:
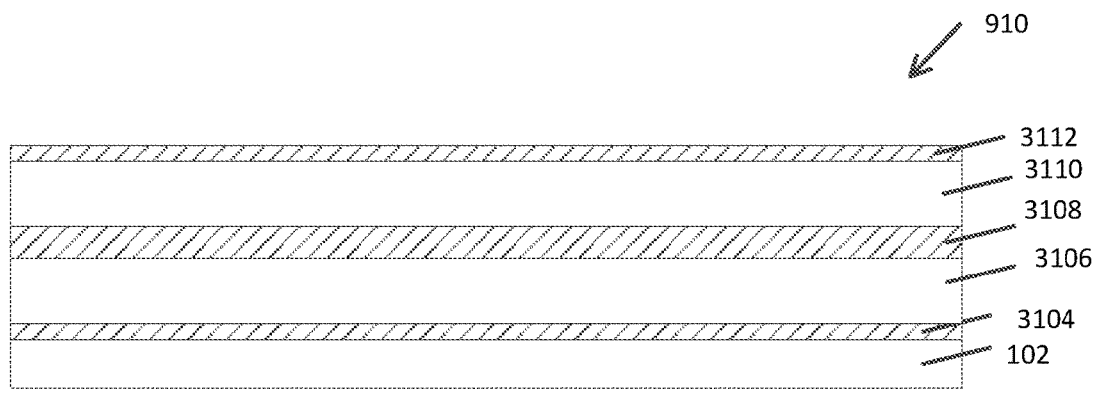
FIGS. 9A, 9B, 9C, 9D, 9E, 9F and 9G illustrate intermediate structures in a process for forming a 3D transistor stack in accordance with another embodiment of the disclosure.
Figure 9B:
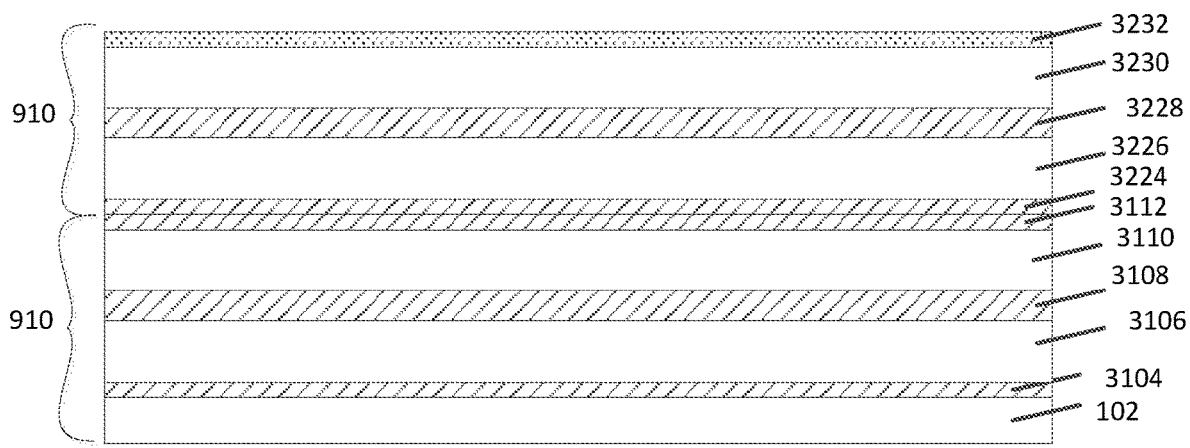
Figure 9C:
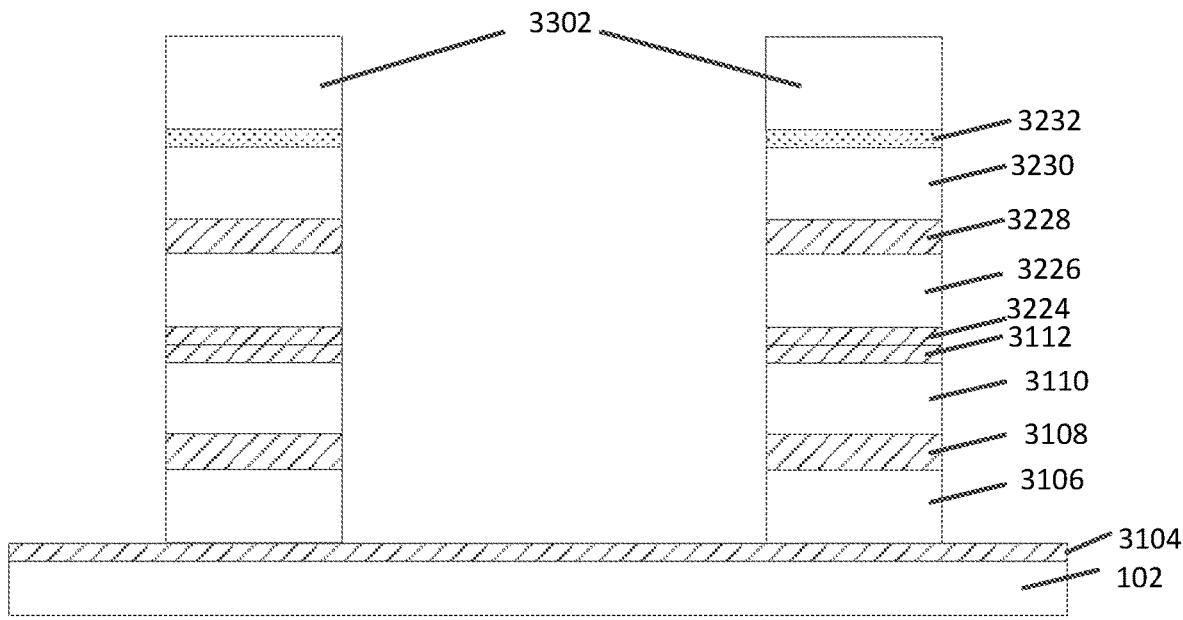
Figure 9D:
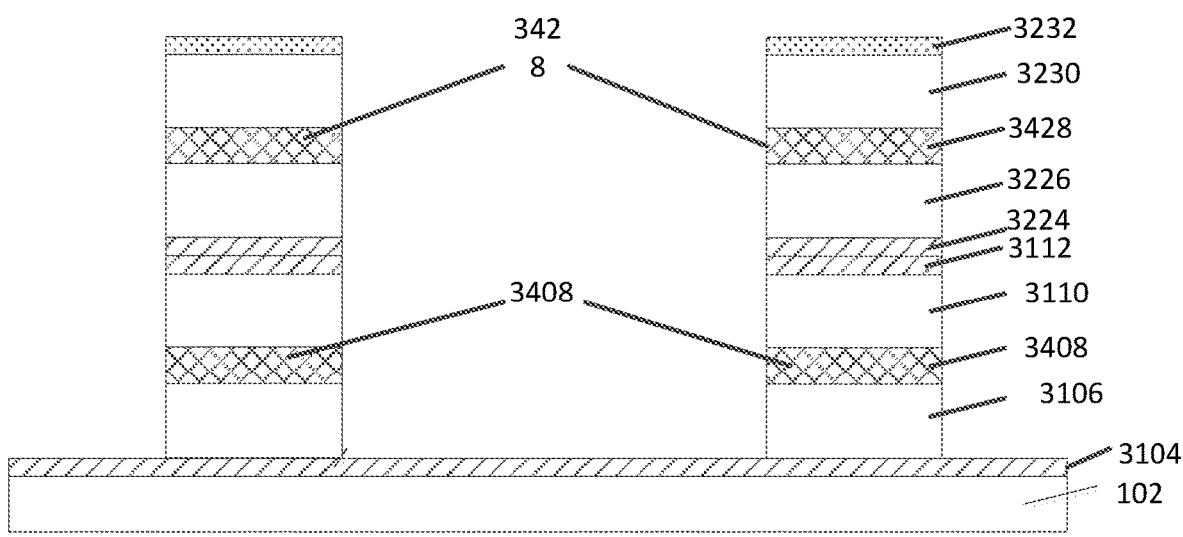

As seen in FIG. 9A, a 3D nanosheet stack with alternating layers of SiGe 3108 and (Si or Ge 3110) is grown upon a silicon 3102/dielectric 3104/silicon 3106 substrate for first wafer 910. The example described herein shows N=2 transistors, but the stack can have 10 to 20 or more layers. FIG. 9B shows a second wafer 920 with a similar substrate stack that is turned over and bonded using a thin dielectric layer 3224 as the interface, then bulk silicon can be removed from one side of the combined wafer so that only one side has bulk silicon 102. A cap layer 3232 or hardmask can be added to the opposite side. As seen in FIG. 9C the combined substrate can have an etch mask 3302 formed thereon, and a directional etch is executed to form channel structures. Vertical isolation 3224, 3112 between tiers is provided from the bonding dielectric as shown in FIG. 9D with the mask 3302 removed. Vertical isolation 3408, 3428 can also be provided as described above using a replacement technique disclosed in U.S. patent application Ser. No. 17/094,947, for example.

Figure 9E:
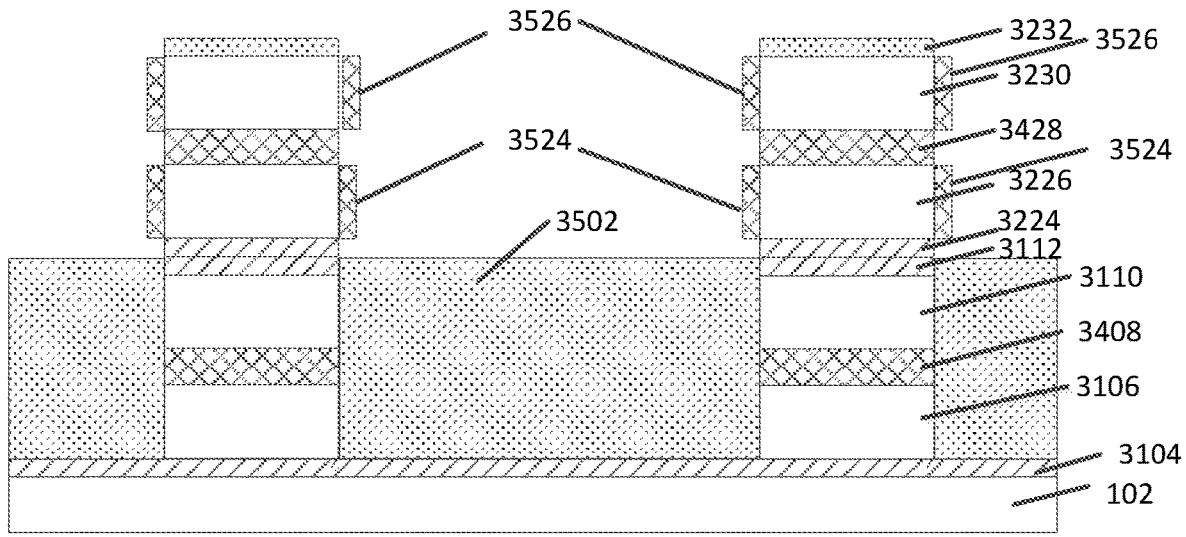
Figure 9F:
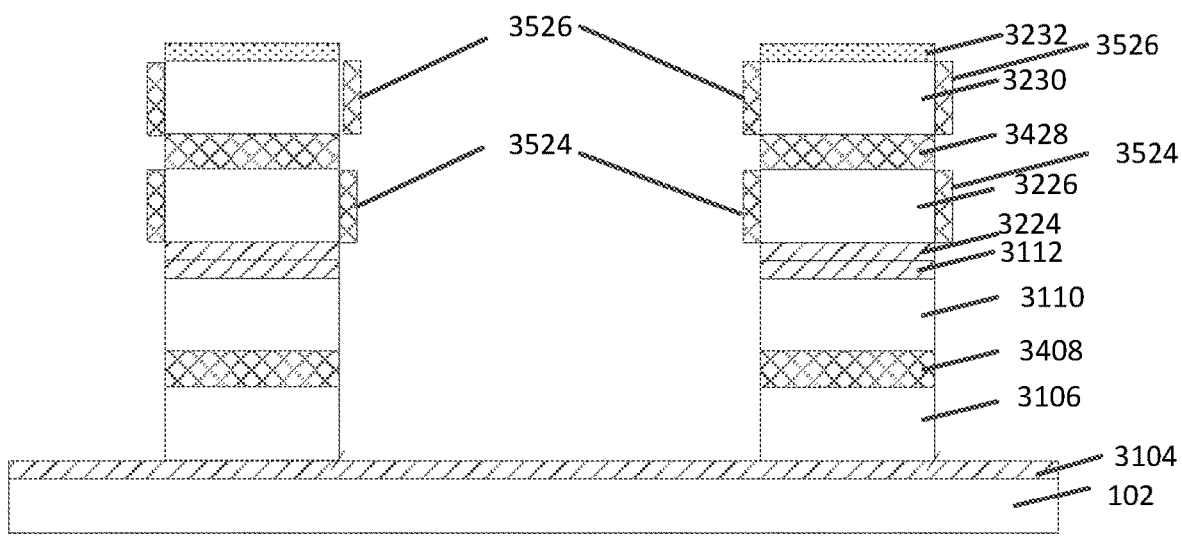
Figure 9G:
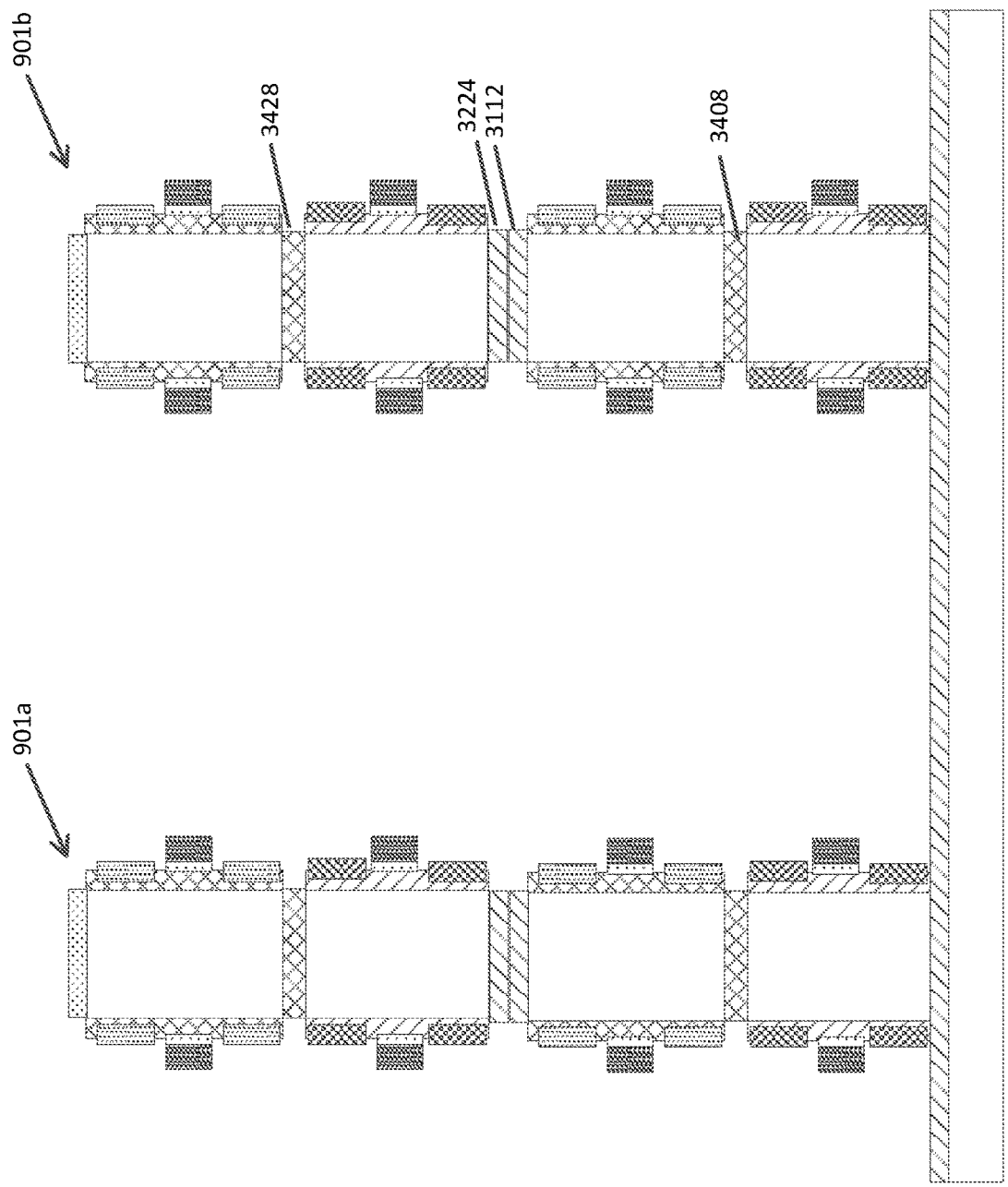

Another embodiment includes making the top two transistors PMOS and bottom 2 transistors NMOS. Another option is to have the mirror image of NMOS on top two and PMOS on bottom two. Then the stack may be generalized to N transistors and any sequence of NMOS, PMOS, or combinations can be fabricated with the selective epi shell techniques disclosed herein. FIG. 9E shows covering of the bottom two transistors/channels with dielectric covering 3502 to grow epi shells of $Si_xGe_y$, 3524, 3526 on the top transistors. The covering 3502 is then removed as shown in FIG. 9F. Additional epi shells may be provided on the bottom channel structures, followed by forming S/D and gate regions for the four vertical transistors (PMOS and NMOS devices) in each stack 901*a* and 901*b* as shown in FIG. 9G. As seen, each of the vertical stacks includes vertical isolations formed by replacement and isolations formed by wafer bonding.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming a transistor device, comprising:
   providing a substrate having a layer stack comprising a plurality of semiconductor channel layers separated by an intermediate layer;
   forming a plurality of core channel structures from the plurality of semiconductor channel layers respectively, the plurality of core channel structures each having a vertical conductive path relative to a surface of the substrate and comprises first and second core channel structures vertically stacked on the substrate and separated by an isolation structure formed from the intermediate layer; and forming a first epitaxial shell around the first core channel structure such that the first epitaxial shell forms at least part of a first transistor channel for a first transistor to be formed from the first core channel structure.

2. The method of claim 1, further comprising:
forming first source/drain (S/D) regions and a first gate structure on the first epitaxial shell to complete the first transistor; and
forming second S/D regions and a second gate structure on a second one of the core channel structures to complete a second transistor vertically stacked with the first transistor on the substrate, wherein the first transistor channel of the first transistor comprises the first epitaxial shell and a second transistor channel of the second transistor is made of the second core channel structure.

3. The method of claim 2, wherein the forming a first epitaxial shell comprises forming the second epitaxial shell with a same material as the first core channel structure such that the first and second transistors have a same conductivity type.

4. The method of claim 2, wherein the forming a first epitaxial shell comprises forming the second epitaxial shell with a different material from the first core channel structure such that the first and second transistors have a different conductivity type.

5. The method of claim 1, further comprising:
forming a second epitaxial shell around a second one of the core channel structures such that the second epitaxial shell forms at least part of a second transistor channel for a second transistor to be formed from the second core channel structure; and
forming first source/drain (S/D) regions and a gate structure on each of the first and second epitaxial shells respectively to complete the first and second respective transistors.

6. The method of claim 5, wherein the forming a second epitaxial shell comprises forming the second epitaxial shell with a same material as the first epitaxial shell such that the first and second transistors have a same conductivity type.

7. The method of claim 5, wherein the forming a second epitaxial shell comprises forming the second epitaxial shell with a different material from the first epitaxial shell such that the first and second transistors have a different conductivity type.

8. The method of claim 1, wherein the providing a substrate having a layer stack comprises:
epitaxially growing a first semiconductor channel layer of the plurality of semiconductor channel layers on the substrate;
epitaxially growing the intermediate layer on the first semiconductor channel layer; and
epitaxially growing a semiconductor channel layer of the plurality of semiconductor channel layers on the intermediate layer.

9. The method of claim 8, further comprising forming the isolation structure by replacing the intermediate layer with a dielectric material.

10. The method of claim 1, wherein the providing a substrate having a layer stack comprises:
providing a first substrate having a first semiconductor channel layer of the plurality of semiconductor channel layers formed on a first insulating layer of the first substrate;
providing a second substrate having a second semiconductor channel layer of the plurality of semiconductor channel layers formed on a second insulating layer of the second substrate; and
wafer bonding the first insulating layer to the second insulating layer to form a combined substrate having the layer stack comprising the plurality of semiconductor channel layers separated by bonded first and second insulating layers forming the intermediate layer.

11. The method of claim 1, wherein:
the providing a substrate comprises providing a substrate having a layer stack comprising multiple semiconductor channel layers separated from each other by a respective intermediate layer; and
the forming a plurality of core channel structures comprises forming multiple core channel structures from the multiple semiconductor channel layers respectively, the multiple core channel structures each having a vertical conductive path relative to a surface of the substrate and comprising the first and second core channel structures and at least one third channel structure vertically stacked on the substrate and separated by isolation structures formed from the respective intermediate layers, wherein each isolation structure is formed from a wafer bonding interface or a replacement insulation material which replaces the intermediate layer.

12. A method of microfabrication of a transistor device, the method comprising:
forming channel structures on a substrate from a layer stack, the channel structures each having a vertical conductive path relative to a surface of the substrate, the channel structures including a vertical stack of two or more levels of channel structures and separated by an isolation structure; and
forming shells around channel structures in at least one of the levels of channel structures by epitaxial growth such that each of the shells is part of a respective transistor channel of a corresponding transistor to be formed in the at least one of the levels of channel structures.

13. The method of claim 12, wherein the forming shells comprises:
covering one or more first levels of channel structures with a dielectric while one or more second levels of channel structures are uncovered; and
forming the shells as first shells around each uncovered channel structure from the one or more second levels of channel structures, the first shells each being formed by epitaxial growth and being part of a transistor channel structure for a corresponding transistor to be formed.

14. The method of claim 13, further comprising:
covering the first shells while uncovering the one or more first levels of channel structures; and
forming second shells around uncovered channel structures from the one or more first levels of channel structures, each of the second shells being formed by epitaxial growth and being part of a respective transistor channel structure for a corresponding transistor to be formed.

15. The method of claim 12, wherein the forming shells comprises:
forming shells around each the channel structures in each of the levels of channel structures by epitaxial growth such that each of the shells is part of a respective transistor channel of a corresponding transistor to be formed;

covering one or more first levels of channel structures with a dielectric while one or more second levels of channel structures are uncovered; and removing the shells from channel structures of the one or more second levels of channel structures.

16. The method of claim 12, further comprising forming the layer stack by at least one of epitaxial growth and bonding two or more wafers.

17. A microfabricated transistor device comprising:

a vertical stack of two or more channels of field effect transistors on a semiconductor substrate and separated from each other by an isolator, each of the channels having a vertical conductive path relative to a surface of the semiconductor substrate, at least one of the channels comprising a shell formed around a core material, the shell comprising epitaxial material.

18. The microfabricated transistor device of claim 17, wherein each of the channels comprising a shell formed around a core material, each of the shells comprising epitaxial material.

19. The microfabricated transistor device of claim 17, wherein the vertical stack includes a channel for a PMOS field effect transistor, and a channel for an NMOS field effect transistor.

* * * * *